(12) United States Patent
Nakamura et al.

(10) Patent No.: US 8,211,624 B2
(45) Date of Patent: Jul. 3, 2012

(54) METHOD FOR PATTERN FORMATION AND RESIN COMPOSITION FOR USE IN THE METHOD

(75) Inventors: Atsushi Nakamura, Tokyo (JP); Tsutomu Shimokawa, Tokyo (JP); Junichi Takahashi, Tokyo (JP); Takayoshi Abe, Tokyo (JP); Tomoki Nagai, Tokyo (JP); Tomohiro Kakizawa, Tokyo (JP)

(73) Assignee: JSR Corporation, Tokyo (JP)

( * ) Notice: Subject to any disclaimer, the term of this patent is extended or adjusted under 35 U.S.C. 154(b) by 307 days.

(21) Appl. No.: 12/601,011

(22) PCT Filed: May 21, 2008

(86) PCT No.: PCT/JP2008/059386
§ 371 (c)(1),
(2), (4) Date: Apr. 14, 2010

(87) PCT Pub. No.: WO2008/143301
PCT Pub. Date: Nov. 27, 2008

(65) Prior Publication Data
US 2010/0190104 A1 Jul. 29, 2010

(30) Foreign Application Priority Data

May 23, 2007 (JP) .................. 2007-136669
Sep. 25, 2007 (JP) .................. 2007-246847

(51) Int. Cl.
G03F 7/00 (2006.01)
G03F 7/004 (2006.01)
G03F 7/20 (2006.01)
G03F 7/26 (2006.01)
G03F 7/40 (2006.01)

(52) U.S. Cl. .......... 430/312; 430/270.1; 430/273.1; 430/322; 430/330; 430/331; 430/905; 430/394; 430/396

(58) Field of Classification Search ........... 430/270.1, 430/271.1, 273.1, 312, 394, 396, 905, 330, 430/331, 322
See application file for complete search history.

(56) References Cited

U.S. PATENT DOCUMENTS 5,595,941 A 1/1997 Okamoto et al.
(Continued)

FOREIGN PATENT DOCUMENTS

| JP | 04-71222 | 3/1992 |
| JP | 05-88375 | 4/1993 |
| JP | 05-232704 | 9/1993 |
| JP | 07-326562 | 12/1995 |
| JP | 10-303114 | 11/1998 |
| JP | 2006-307179 | 11/2006 |
| WO | WO 2005/116776 | 12/2005 |

OTHER PUBLICATIONS

A. Kaneko et al. Sidewall Transfer Process and Selective Gate Sidewall Spacer Formation Technology for Sub-15nm FinFET with Elevated Source/Drain Extension, International Electron Devices Meeting Technical Digest, Dec. 2005, pp. 863-866.

*Primary Examiner* — Amanda C. Walke
(74) *Attorney, Agent, or Firm* — Ditthavong Mori & Steiner, P.C.

(57) ABSTRACT

A pattern forming method includes (1) selectively exposing a first resist layer, and developing the exposed first resist layer to form a first pattern, (2) applying a resin composition containing a hydroxyl group-containing resin and a solvent to the first pattern, baking the applied resin composition, and developing the baked resin composition to form a second pattern, the hydroxyl group-containing resin becoming insoluble or scarcely soluble in a developer when baked, and (3) totally or selectively exposing the second pattern to make the second pattern partly soluble in the developer, and developing the exposed second pattern to form a third pattern in which at least a hole or a groove is formed in the second pattern.

19 Claims, 3 Drawing Sheets

U.S. PATENT DOCUMENTS

| | | |
|---|---|---|
| 5,688,723 A | 11/1997 | Okamoto et al. |
| 5,710,066 A | 1/1998 | Okamoto et al. |
| 7,745,093 B2 * | 6/2010 | Nishibe et al. .............. 430/270.1 |
| 8,067,146 B2 * | 11/2011 | Jung ............................. 430/311 |
| 8,105,760 B2 * | 1/2012 | Hatakeyama et al. ........ 430/315 |
| 8,124,312 B2 * | 2/2012 | Ishikawa et al. ........... 430/270.1 |
| 2007/0259287 A1 * | 11/2007 | Sakakibara et al. ........ 430/270.1 |
| 2009/0280440 A1 * | 11/2009 | Tarutani et al. ............... 430/325 |
| 2010/0209849 A1 * | 8/2010 | Watanabe et al. .......... 430/285.1 |
| 2010/0310988 A1 * | 12/2010 | Abe et al. ................... 430/270.1 |
| 2010/0323292 A1 * | 12/2010 | Nakamura et al. ......... 430/270.1 |

* cited by examiner

METHOD FOR PATTERN FORMATION AND RESIN COMPOSITION FOR USE IN THE METHOD

TECHNICAL FIELD

The present invention relates to a method of forming a fine pattern and a resin composition used in the method.

BACKGROUND ART

In the field of microfabrication represented by the manufacture of integrated circuit devices, lithographic technology enabling microfabrication with a line width of 0.1 μm or less has been demanded in recent years in order to increase the degree of integration. However, microfabrication at a sub-quarter micron level is said to be very difficult using near ultraviolet rays such as i-rays which are generally used as radiation in a lithography process. Therefore, in order to enable microfabrication with a line width of 0.1 μm or less, use of radiation with a shorter wavelength has been studied. As examples of such short wavelength radiation, a bright line spectrum of a mercury lamp, deep ultraviolet rays represented by excimer lasers, X rays, electron beams, and the like can be given. A KrF excimer laser (wavelength: 248 nm) or an ArF excimer laser (wavelength: 193 nm) are being given particular attention.

As a resist suitable for being irradiated with such an excimer laser, many resists utilizing the chemical amplification effect of a component having an acid-dissociable functional group (hereinafter referred from time to time to as "an acid generator") and exposure to radiation (hereinafter referred to from time to time simply as "exposure") have been proposed. Such a resist is hereinafter referred to from time to time as a "chemically-amplified resist". As a chemically amplified resist, a resist containing a resin having a tert-butyl ester group of carboxylic acid or a tert-butyl carbonate group of phenol and an acid generator has been proposed (see Patent Document 1, for example). The principle of the method is as follows. The tert-butyl ester group or tert-butyl carbonate group in the resin dissociates by the action of an acid generated upon exposure, whereby the resist is provided with an acidic group such as a carboxylic group or a phenolic hydroxyl group. As a result, the exposed areas of the resist film become readily soluble in an alkaline developer.

A capability of forming a finer pattern (e.g., a fine resist pattern with a line width of about 45 nm) will be required for such a lithographic process in the future. Reducing the wavelength of a light source of an exposure apparatus and increasing the numerical aperture (NA) of a lens could be a means for forming such a pattern with a line width of less than 45 nm. However, an expensive exposure apparatus is necessary for reducing the wavelength of a light source. In addition, increasing the numerical aperture (NA) of a lens involves a problem of decreasing the depth of focus even if resolution is increased due to the trade-off relationship between the resolution and the depth of focus.

Recently, a liquid immersion lithographic method has been reported as a lithographic technique enabling solution of such a problem (for example, see Patent Document 2). In the liquid immersion lithographic process, a layer of a liquid high refractive index medium (liquid for liquid immersion lithography) such as pure water or a fluorine-containing inert liquid is caused to be present between the lens and the resist film on a substrate, at least on the surface of the resist film during exposure. According to this method, an inert gas in the light-path space for exposure light, such as air and nitrogen, is replaced by a liquid with a larger refractive index (n), for example, pure water, whereby resolution can be increased without a decrease in focal depth by using a light source with a given wavelength to the same degree as in the case in which a light source with a shorter wavelength is used or the case in which a higher NA lens is used. Since a resist pattern with a higher resolution excelling in focal depth can be formed at a low cost using a lens mounted in existing apparatuses by using the liquid immersion lithographic method, the method has received a great deal of attention and is currently being put into practice.

Although downsizing of the line width of the above exposure technology is said to be up to 45 nm hp at most, the technological development is advancing toward a 32 nm hp generation requiring further minute fabrication. Since the apparatus (liquid immersion lithographic apparatus) used for the liquid immersion lithographic method is very expensive, the method lacks practical utility in the actual semiconductor manufacturing process.

On the other hand, following the complication and demand for high integration of devices, a pattern forming method of using a thin film formed on the surface of the wall on the right and left sides of a dummy pattern as a gate electrode or the like after removing the dummy pattern has been proposed in order to reduce linewide roughness (LWR), (for example, refer to Nonpatent Document 1). In the pattern forming method proposed in the Nonpatent Document 1, the LWR is reduced by evaluating the variation of the threshold voltage of a transistor. However, the method can be used only with difficulty for forming a finer pattern.

Patent Document 1: JP-A-5-232704
Patent Document 2: JP-A-10-303114
Non-patent Document 1: International Electron Devices, Meeting Technical Digest, pp. 863-866, December 2005

DISCLOSURE OF THE INVENTION

The present invention has been conceived in view of the above problems, and has an object of providing a pattern forming method with high utility which can simply and efficiently form a fine pattern and can be applied to a semiconductor manufacturing process, as well as a resin composition used in the method.

The inventors of the present invention have conducted extensive studies in order to achieve the above object. As a result, the inventors have found that the above object can be achieved by the following pattern forming method and resin composition. This finding has led to the completion of the present invention.

According to the present invention, the following pattern forming method and resin composition are provided.

[1] A pattern forming method comprising (1) forming a first resist layer on a substrate using a first positive-tone radiation-sensitive resin composition, selectively exposing the first resist layer, and developing the exposed first resist layer to form a first pattern, (2) applying a resin composition comprising a hydroxyl group-containing resin and a solvent to the first pattern, baking the applied resin composition, and washing the baked resin composition using a developer to form a second pattern in which the surface of the first pattern is covered with the resin composition, the hydroxyl group-containing resin becoming insoluble or scarcely soluble in the developer when baked, and (3) totally or selectively exposing the second pattern to make the second pattern partly soluble in the developer, and developing the exposed second pattern to form a third pattern in which at least a hole or a groove is formed in the second pattern.

[2] The pattern forming method according to [1], further comprising applying a second positive-tone radiation-sensitive resin composition to the second pattern, and baking the applied composition to form a second resist layer after the step (2) but before the step (3), wherein the step (3) includes totally or selectively exposing the second resist layer and the second pattern to make the second resist layer and the second pattern partly soluble in the developer.

[3] The resist pattern forming method according to [2], wherein at least one of the first positive-tone radiation-sensitive resin composition and the second positive-tone radiation-sensitive resin composition comprises a resin having a repeating unit shown by the following general formula (1),

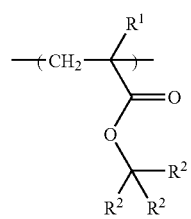

wherein $R^1$ represents a hydrogen atom or a methyl group, and $R^2$s individually represent a monovalent alicyclic hydrocarbon group having 4 to 20 carbon atoms or a derivative thereof, or a linear or branched alkyl group having 1 to 4 carbon atoms, provided that (i) at least one of the $R^2$s is a monovalent alicyclic hydrocarbon group having 4 to 20 carbon atoms or a derivative thereof, or (ii) two of the $R^2$s form a divalent alicyclic hydrocarbon group having 4 to 20 carbon atoms or a derivative thereof together with the carbon atom to which the two $R^2$s bond, and the remaining $R^2$ is a linear or branched alkyl group having 1 to 4 carbon atoms, a monovalent alicyclic hydrocarbon group having 4 to 20 carbon atoms, or a derivative thereof.

[4] The pattern forming method according to [2] or [3], wherein the second positive-tone radiation-sensitive resin composition comprises at least one of an iodonium salt compound and a sulfonium salt compound that are decomposed upon exposure to generate a base.

[5] A resin composition that is used in the step (2) of the pattern forming method according to any one of [1] to [4], the resin composition comprising a hydroxyl group-containing resin and a solvent, the hydroxyl group-containing resin becoming insoluble or scarcely soluble in a developer when baked.

[6] The resin composition according to [5], wherein the hydroxyl group-containing resin has been obtained by polymerizing a monomer component which contains at least one of hydroxyacrylanilide and hydroxymethacrylanilide.

[7] The resin composition according to [5] or [6], wherein the hydroxyl group-containing resin has a repeating unit shown by the following general formula (4),

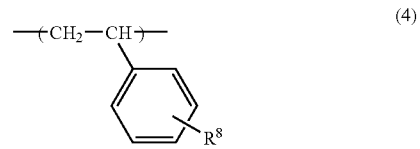

wherein $R^8$ represents a hydrogen atom, a linear or branched alkyl group having 1 to 8 carbon atoms, or a linear or branched alkoxy group having 1 to 8 carbon atoms.

According to the pattern forming method of the present invention, a fine resist pattern can be conveniently and efficiently formed. Therefore, the pattern forming method of the present invention is highly applicable in practice, and can be used for a semiconductor manufacturing process.

According to the resin composition of the present invention, a fine resist pattern can be conveniently and efficiently formed.

EXPLANATION OF SYMBOLS

Figure 1:
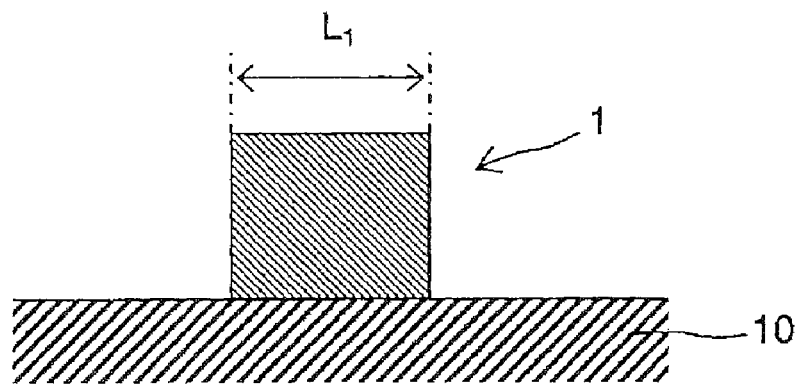
FIG. 1 is a cross-sectional view schematically showing an example of the first pattern.

1: First pattern
2: Second pattern
3, 13: Third pattern
5: Covering layer
5a: Upper covering part
5b: Side covering part
10: Substrate
11: First pattern residue
12: Second resist layer
15: Covering layer residue
20: Hole
22: Second resist layer residue
30: Groove
$L_1$ to $L_5$: Line width

BEST MODE FOR CARRYING OUT THE INVENTION

Preferred embodiments of the present invention are described below. Note that the present invention is not limited to the following embodiments. Various modifications and improvements may be made on the embodiments without departing from the scope of the present invention based on the knowledge of a person skilled in the art. In the following description, the terms "first positive-tone radiation-sensitive resin composition" and "second positive-tone radiation-sensitive resin composition" are respectively referred to as "first resist agent" and "second resist agent". In the present description, the terms "hole" and "groove" refer to those openings formed from the upper face of the second pattern (exposed face) through the surface of the substrate (or the surface of an antireflection film, a protective film, etc. when these films are formed).

1. Resin Composition (Hydroxyl Group-Containing Resin)

The resin containing a hydroxyl group (referred to from time to time as "hydroxyl group-containing resin") included in the resin composition of the present invention is preferably a resin containing a structural unit which has at least one hydroxyl group (—OH) derived from at least one of an alcohol, a phenol, and a carboxylic acid.

The hydroxyl group-containing resin can be obtained by copolymerizing a monomer component which contains monomers having at least one hydroxyl group selected from an alcoholic hydroxyl group, a hydroxyl group derived from an organic acid such as a carboxylic acid, and a phenolic hydroxyl group. As examples of the monomer containing an alcoholic hydroxyl group, hydroxyalkyl(meth)acrylates such as 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate, glycerol monomethacrylate, and the like can be given. Of these, preferable monomers are 2-hydroxyethyl acrylate and 2-hydroxyethyl methacrylate. These monomers may be used either individually or in combination of two or more. The proportion of the monomers having the alcoholic hydroxyl group in all the monomers forming the hydroxyl group-containing resin is usually 5 to 90 mol %, and preferably 10 to 60 mol %.

As examples of the monomers containing a hydroxyl group derived from an organic acid such as a carboxylic acid, monocarboxylic acids such as acrylic acid, methacrylic acid, crotonic acid, 2-succinoloylethyl(meth)acrylate, 2-maleinoloylethyl(meth)acrylate, 2-hexahydrophthaloylethyl (meth) acrylate, omega-carboxy-polycaprolactone monoacrylate, phthalic acid monohydroxyethyl acrylate, acrylic acid dimer, 2-hydroxy-3-phenoxypropyl acrylate, t-butoxy methacrylate, and t-butyl acrylate; (meth)acrylic acid derivatives having a carboxyl group such as dicarboxylic acids such as maleic acid, fumaric acid, citraconic acid, mesaconic acid, or itaconic acid; and the like can be given. Of these, acrylic acid, methacrylic acid, and 2-hexahydrophthaloylethyl methacrylate are preferable. These monomers may be used either individually or in combination of two or more. The proportion of these monomers in all the monomers forming the hydroxyl group-containing resin is usually 5 to 90 mol %, and preferably 10 to 60 mol %.

As an example of a commercially available product of the omega-carboxy-polycaprolactone monoacrylate, Aronix M-5300 manufactured by Toagosei Co., Ltd. can be given. As an example of a commercially available product of the acrylic acid dimer, Aronix M-5600 manufactured by Toagosei Co., Ltd. can be given. As an example of a commercially available product of the 2-hydroxy-3-phenoxypropyl acrylate, Aronix M-5700 manufactured by Toagosei Co., Ltd. can be given.

As examples of the monomer containing a phenolic hydroxyl group, p-hydroxystyrene, m-hydroxystyrene, o-hydroxystyrene, α-methyl-p-hydroxystyrene, α-methyl-m-hydroxystyrene, α-methyl-o-hydroxystyrene, 2-allylphenol, 4-allylphenol, 2-allyl-6-methylphenol, 2-allyl-6-methoxyphenol, 4-allyl-2-methoxyphenol, 4-allyl-2,6-dimethoxyphenol, 4-allyloxy-2-hydroxybenzophenone, and the like can be given. Of these, p-hydroxystyrene and α-methyl-p-hydroxystyrene are preferable.

As a monomer having a phenolic hydroxyl group, a monomer having an amide bond (amide group) in the molecule is preferable. As a preferable example of such a monomer, a monomer shown by the following general formula (5) can be given.

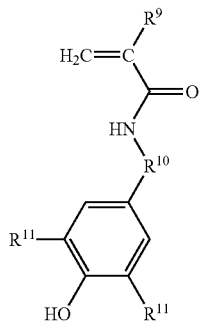

(5)

In the general formula (5), $R^9$ and $R^{11}$ represent hydrogen atoms or methyl groups and $R^{10}$ represents a single bond or a linear or cyclic divalent hydrocarbon group. As specific examples of $R^{10}$, saturated linear hydrocarbon groups such as a methylene group, an ethylene group, a propylene group (1,3-propylene group, 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a propylidene group, and a 2-propylidene group; monocyclic hydrocarbon groups such as cycloalkylene groups having 3 to 10 carbon atoms such as cyclobutylene groups (e.g., a 1,3-cyclobutylene group), cyclopentylene groups (e.g., a 1,3-cyclopentylene group), cyclohexylene groups (e.g., a 1,4-cyclohexylene group), and cyclooctylene groups (e.g., a 1,5-cyclooctylene group); bridged cyclic hydrocarbon groups such as cyclic hydrocarbon groups with 2 to 4 rings having 4 to 30 carbon atoms such as norbornylene groups (e.g., 1,4-norbornylene group, 2,5-norbornylene group), and admantylene groups (e.g., 1,5-admantylene group, 2,6-admantylene group); and the like can be given. As the monomer shown by general formula (5), p-hydroxymethacrylanilide is preferable. The proportion of the monomers having a phenolic hydroxyl group shown by general formula (5) in all the monomers forming the hydroxyl group-containing resin is usually 30 to 95 mol %, and preferably 40 to 90 mol %.

It is possible to copolymerize monomers containing a specific functional group which is convertible into a phenolic hydroxyl group after the copolymerization. Such a monomer is hereinafter referred to as "a specific functional group-containing monomer". As specific examples of the specific functional group-containing monomer, p-acetoxystyrene, α-methyl-p-acetoxystyrene, p-benzyloxystyrene, p-tert-butoxystyrene, p-tert-butoxycarbonyloxystyrene, p-tert-butyldimethylsiloxystyrene, and the like can be given. The specific functional group in the copolymer obtained by the copolymerization of these specific functional group-containing monomers can be easily converted into a phenolic hydroxyl group by a suitable treatment, for example, by hydrolysis using hydrochloric acid or the like. The proportion of these specific functional group-containing monomers in all the monomers forming the hydroxyl group-containing resin is usually 5 to 90 mol %, and preferably 10 to 80 mol %.

The use proportion of the monomers having a alcoholic hydroxyl group, the monomers having a hydroxyl group derived from an organic acid such as a carboxylic acid, and the monomers having a phenolic hydroxyl group in all the monomers forming the hydroxyl group-containing resin is usually in the range respectively mentioned above. If the content of the group having a hydroxyl group is too small, pattern shrinkage takes place only with difficulty due to too small a number of the sites reactive with the later-described crosslinking component. If the content of the group having a hydroxyl group is too large, on the other hand, the pattern may be buried due to swelling during development.

The hydroxyl group-containing resin preferably has a repeating unit shown by the following general formula (4),

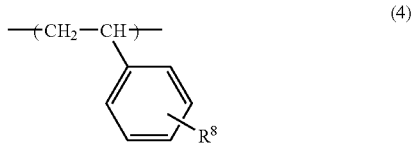

(4)

wherein $R^8$ represents a hydrogen atom, a linear or branched alkyl group having 1 to 8 carbon atoms, or a linear or branched alkoxy group having 1 to 8 carbon atoms. As $R^8$, a tert-butyl group, an acetoxy group, and a 1-ethoxyethoxy group are preferable, with a tert-butyl group being particularly preferable. The repeating unit shown by the general formula (4) can be formed by copolymerizing styrene derivatives as monomers. A preferable styrene derivative used as the monomer in this instance is tert-butoxystyrene.

In producing the hydroxyl group-containing resin, other monomers may be copolymerized in order to control hydrophilicity and solubility of the resin. As specific examples of the other monomers, (meth)acrylic acid aryl esters, dicarboxylic acid diesters, nitrile group-containing polymerizable compounds, amide bond-containing polymerizable compounds, vinyl compounds, allyl compounds, chlorine-containing polymerizable compounds, conjugated diolefins, and the like can be given. Specific examples include dicarboxylic acid diesters such as diethyl maleate, diethyl fumarate, and diethyl itaconate; (meth) acrylic acid aryl esters such as phenyl(meth)acrylate and benzyl(meth)acrylate; aromatic vinyl compounds such as styrene, α-methylstyrene, m-methylstyrene, p-methylstyrene, vinyltoluene, p-methoxystyrene, and p-t-butoxystyrene; (meth)acrylates such as t-butyl(meth) acrylate and 4,4,4-trifluoro-3-hydroxy-1-methyl-3-trifluoromethyl-1-butyl (meth)acrylate; nitrile group-containing polymerizable compounds such as acrylonitrile and methacrylonitrile; amide bond-containing polymerizable compounds such as acrylamide and methacrylamide; fatty-acid vinyl compounds such as vinyl acetate; chlorine-containing polymerizable compounds such as vinyl chloride and vinylidene chloride; conjugated diolefins such as 1,3-butadiene, isoprene, and 1,4-dimethylbutadiene; and the like. These monomers may be used either individually or in combination of two or more.

As preferable specific examples of the other monomers, compounds shown by the following general formula (11) can be given.

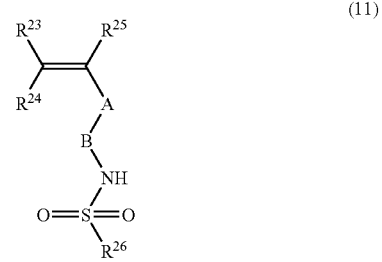

(11)

wherein $R^{23}$, $R^{24}$, and $R^{25}$ individually represent a hydrogen atom, an alkyl group having 1 to 10 carbon atoms, a hydroxymethyl group, a trifluoromethyl group, or a phenyl group, A represents a single bond, an oxygen atom, a carbonyl group, a carbonyloxy group, or an oxycarbonyl group, B represents a single bond or a divalent organic group having 1 to 20 carbon atoms, and $R^{26}$ represents a monovalent organic group.

As examples of the alkyl group having 1 to 10 carbon atoms represented by $R^{23}$, $R^{24}$, and $R^{25}$ in the above general formula (11), a methyl group, an ethyl group, a propyl group, a butyl group, a pentyl group, a hexyl group, a heptyl group, an octyl group, a nonyl group, and a decyl group can be given. $R^{23}$ and $R^{24}$ are preferably hydrogen atoms and $R^{25}$ is preferably a hydrogen atom or a methyl group.

In the general formula (11), $R^{26}$ represents a monovalent organic group, preferably a monovalent organic group containing a fluorine atom. $R^{26}$ is preferably a fluoroalkyl group having 1 to 20 carbon atoms, and more preferably a fluoroalkyl group having 1 to 4 carbon atoms.

As specific examples of the fluoroalkyl group having 1 to 20 carbon atoms, a difluoromethyl group, a perfluoromethyl group, a 1,1-difluoroethyl group, a 2,2-difluoroethyl group, a 2,2,2-trifluoroethyl group, a perfluoroethyl group, a 1,1,2,2-tetrafluoropropyl group, a 1,1,2,2,3,3-hexafluoropropyl group, a perfluoroethylmethyl group, a 1-(trifluoromethyl)-1,2,2,2-tetrafluoroethyl group, a perfluoropropyl group, a 1,1,2,2-tetrafluorobutyl group, a 1,1,2,2,3,3-hexafluorobutyl group, a 1,1,2,2,3,3,4,4-octafluorobutyl group, a perfluorobutyl group, a 1,1-bis(trifluoro)methyl-2,2,2-trifluoroethyl group, a 2-(perfluoropropyl)ethyl group, a 1,1,2,2,3,3,4,4-octafluoropentyl group, a perfluoropentyl group, a 1,1,2,2,3,3,4,4,5,5-decafluoropentyl group, a 1,1-bis(trifluoromethyl)-2,2,3,3,3-pentafluoropropyl group, a perfluoropentyl group, a 2-(perfluorobutyl)ethyl group, a 1,1,2,2,3,3,4,4,5,5-decafluorohexyl group, a 1,1,2,2,3,3,4,4,5,5,6,6-dodecafluorohexyl group, a perfluoropentylmethyl group, a perfluorohexyl group, a 2-(perfluoropentyl)ethyl group, a 1,1,2,2,3,3,4,4,5,5,6,6-dodecafluoroheptyl group, a perfluorohexylmethyl group, a perfluoroheptyl group, a 2-(perfluorohexyl)ethyl group, a 1,1,2,2,3,3,4,4,5,5,6,6,7,7-tetra-decafluorooctyl group, a perfluoroheptylmethyl group, a perfluorooctyl group, a 2-(perfluoroheptyl)ethyl group, a 1,1,2,2,3,3,4,4,5, 5,6,6,7,7,8,8-hexadecafluorononyl group, a perfluorooctylmethyl group, a perfluorononyl group, a 2-(perfluorooctyl) ethyl group, a 1,1,2,2,3,3,4,4,5,5,6,6,7,7,8,8,9,9- octadecafluorodecyl group, a perfluorononylmethyl group, and a perfluorodecyl group can be given.

Among these specific examples of the fluoroalkyl group having 1 to 20 carbon atoms, those having a large number of carbon atoms in the fluoroalkyl group tends to reduce solubility of the resulting hydroxyl group-containing resin in an alkaline aqueous solution. For this reason, a perfluoromethyl group, a perfluoroethyl group, and a perfluoropropyl group are preferable among these specific examples of the fluoroalkyl group having 1 to 20 carbon atoms.

As the divalent organic group having 1 to 20 carbon atoms represented by B in the general formula (11), a methylene group; an ethylene group; a propylene group (e.g., a 1,3-propylene group, a 1,2-propylene group); saturated linear hydrocarbon groups such as a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; monocyclic hydrocarbon groups such as cycloalkylene groups having 3 to 10 carbon atoms such as cyclobutylene groups (e.g., 1,3-cyclobutylene group), cyclopentylene groups (e.g., 1,3-cyclopentylene group), cyclohexylene groups (e.g., 1,4-cyclohexylene group), and cyclooctylene groups (e.g., 1,5-cyclooctylene group); 2 to 4 ring bridged cyclic hydrocarbon groups having 4 to 30 carbon atoms such as norbornylene groups (e.g., 1,4-norbornylene group, 2,5-norbornylene group), and admantylene groups (e.g., 1,5-admantylene group, 2,6-admantylene group); and the like can be given.

The preferable "other monomers" represented by the general formula (11) include 2-(((trifluoromethyl)sulfonyl)amino)ethyl-1-methacrylate, 2-(((trifluoromethyl)sulfonyl)amino)ethyl-1-acrylate, and compounds shown by the following formulas (11-1) to (11-6):

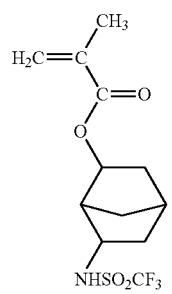

(11-1)

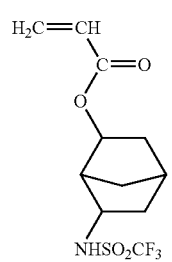

(11-2)

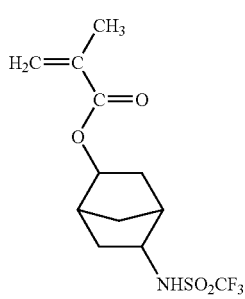

(11-3)

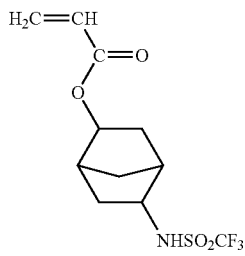

(11-4)

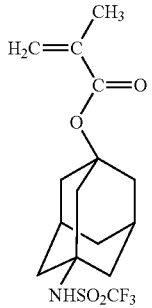

(11-5)

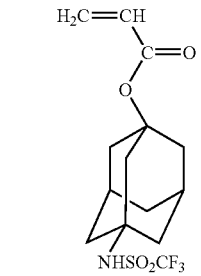

(11-6)

The use proportion of the monomers shown by the above general formula (11) in all monomers forming the hydroxyl group-containing resin is usually 1 to 50 mol %, preferably 2 to 30 mol %, and more preferably 2 to 20 mol %.

(Preparation Method of Hydroxyl Group-Containing Resin)

The hydroxyl group-containing resin is prepared by, for example, polymerizing the monomers in an appropriate solvent in the presence of a chain transfer agent, as required, using a radical polymerization initiator such as hydroperoxides, dialkyl peroxides, diacyl peroxides, or azo compounds. As examples of the solvent which can be used for the polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, methyl propionate, and propylene glycol monomethyl ether acetate; alkyllactones such as γ-butyrolactone; ethers such as tetrahydrofuran, dimethoxyethanes, and diethoxyethanes; alkylketones such as 2-butanone, 2-heptanone, and methyl isobutyl ketone; cycloalkylketones such as cyclohexanone; alcohols such as 2-propanol, 1-butanol, 4-methyl-2-pentanol, and propylene glycol monomethyl ether; and the like can be given. These solvents may be used either individually or in combination of two or more.

The polymerization temperature is normally from 40 to 120° C., and preferably from 50 to 100° C. The reaction time is normally from 1 to 48 hours, and preferably from 1 to 24 hours.

It is preferable that the hydroxyl group-containing resin have high purity. Not only is the content of impurities such as halogens or metals preferably small, but also the content of resisual monomers and oligomers is preferably less than the predetermined amount, for example, the content determined by HPLC is preferably 0.1 mass % or less. Use of an insolubilized resin composition containing a high purity hydroxyl group-containing resin ensures improvement of process stability and further precision of the pattern shape. The following methods can be given as preferable examples of purification methods of the hydroxyl group-containing resin. As a method for removing impurities such as metals, a method of causing metals in the polymer solution to be adsorbed using a zeta-potential filter, a method of causing metals to be in a chelate state by washing the polymer solution with an acidic aqueous solution such as oxalic acid or sulfonic acid aqueous solution and removing the metals, and the like can be given. As a method for reducing the concentration of the residual monomers and oligomer components to a value not more than a specific value, a liquid-liquid extraction method in which the residual monomers and oligomer components are removed by washing with water or a combination of suitable solvents, a purification method in a solution state such as ultrafiltration in which only the monomers and oligomer components having a specific molecular weight or less are extracted and removed, a reprecipitation method in which the residual monomers and the like are removed by adding the polymer solution to a poor solvent dropwise, thereby causing the resin to coagulate in the poor solvent, a purification method in a solid state in which the resin slurry separated by filtration is washed with a poor solvent, and the like can be given. These methods may be used in combination.

The polystyrene-reduced weight average molecular weight (Mw) of the hydroxyl group-containing resin obtained in this manner determined by gel permeation chromatography (GPC) is 1000 to 500,000, preferably 1000 to 50,000, and more preferably 1000 to 20,000. If the molecular weight is too large, the resin may not be removed by a developer after curing with heat. If too small, a uniform coating film may not be formed after application.

(Solvent)

The solvent used for the resin composition of the present invention is preferably a solvent which can sufficiently dissolve the hydroxyl group-containing resin and the later-described crosslinking agent, when such a crosslinking agent is used, but does not dissolve the first pattern formed by the first resist agent. As examples of such a solvent, a non-aqueous solvent containing an alcohol and a solvent with a water content including an alcohol of not more than 10 mass % (alcohol solvent) can be given.

A monohydric alcohol having 1 to 8 carbon atoms is preferable as the alcohol included in the non-aqueous solvent and the alcohol solvent. As specific examples, 1-propanol, isopropanol, 1-butanol, 2-butanol, tert-butanol, 1-pentanol, 2-pentanol, 3-pentanol, 2-methyl-1-butanol, 3-methyl-1-butanol, 3-methyl-2-butanol, 1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 1-heptanol, 2-heptanol, 2-methyl-2-heptanol, 2-methyl-3-heptanol, and the like can be given. Of these, 1-butanol, 2-butanol, and 4-methyl-2-pentanol are preferable. These alcohols may be used either individually or in combination of two or more.

The alcohol solvents may contain water in an amount of not more than 10 mass %, and preferably not more than 3 mass % relative to the total amount of the solvent. If the water content of the alcohol solvent exceeds 10 mass %, solubility of the hydroxyl group-containing resin tends to be reduced. An absolute alcohol solvent which does not substantially contain water is particularly preferable.

(Other Solvents)

When applying the resin composition of the present invention onto the first pattern, "other solvents" may be mixed in order to adjust applicability. The "other solvents" allow the resin composition to be evenly applied without eroding the first pattern.

As specific examples of the "other solvents", cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; and esters such as ethyl acetate, butyl acetate, ethyl 2-hydroxypropionate, ethyl 2-hydroxy-2-methylpropionate, ethyl 2-hydroxy-2-methylpropionate, ethoxyethyl acetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, butyl acetate, and water can be given. Of these, cyclic ethers, alkyl ethers of polyhydric alcohol, alkyl ether acetates of polyhydric alcohol, ketones, esters, and water are preferable.

The amount of the "other solvents" is not more than 30 mass %, and preferably not more than 20 mass % of the total amount of the solvent. If the amount of the "other solvents" is more than 30 mass %, the first pattern may be buried due to a failure such as intermixing with the insolubilized resin composition caused by erosion of the first pattern. When water is used as the "other solvent", the amount is preferably 10 mass % or less.

(Crosslinking Components)

It is preferable that the resin composition of the present invention include a crosslinking agent as required. The crosslinking agent accelerates the reaction of the first resist agent and the hydroxyl group-containing resin and easily forms the third pattern which is insoluble in the developer. The crosslinking agent preferably comprises a compound having a group shown by the following general formula (2) (hereinafter referred to as "crosslinking component I") or a compound having two or more cyclic ethers as reactive groups (hereinafter referred to as "crosslinking component II"). It is preferable that the crosslinking agent contain both the crosslinking component I and the crosslinking component II.

(2)

wherein $R^3$ and $R^4$ represent a hydrogen atom or a group shown by the following general formula (3), provided that at least $R^3$ or $R^4$ is a group shown by the following formula (3),

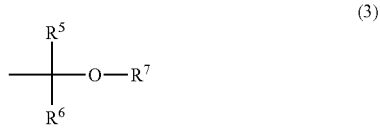
(3)

wherein $R^5$ and $R^6$ represent a hydrogen atom, an alkyl group having 1 to 6 carbon atoms, an alkoxyalkyl group having 1 to 6 carbon atoms, or $R^5$ and $R^6$ bond together to form a ring having 2 to 10 carbon atoms, and $R^7$ represents a hydrogen atom or an alkyl group having 1 to 6 carbon atoms. The crosslinking component has an effect of curing the hydroxyl group-containing resin by reacting with the hydroxyl group-containing resin and/or among the crosslinking agents by the action of an acid.

As specific examples of the crosslinking component I, compounds having a functional group such as an imino group, a methylol group, and a methoxymethyl in the molecule can be given. More specific examples include nitrogen-containing compounds prepared by alkyl-ethrification of all or a part of active methylol groups of a compound such as (poly)methylolized melamine, (poly)methylolized glycoluril, (poly)methylolized benzoquanamine, (poly)methylolized urea, or the like. As the alkyl group, a methyl group, an ethyl group, a butyl group, and a mixture of these groups may be given. The nitrogen-containing compound may include an oligomer component obtained by self-condensation of a part thereof. As specific examples of the nitrogen-containing compound, hexamethoxymethylated melamine, hexabutoxymethylated melamine, tetramethoxymethylated glycoluril, tetrabutoxymethylated glycoluril, and the like can be given.

As commercially available compounds among the crosslinking components I, Cymel 300, Cymel 301, Cymel 303, Cymel 350, Cymel 232, Cymel 235, Cymel 236, Cymel 238, Cymel 266, Cymel 267, Cymel 285, Cymel 1123, Cymel 1123-10, Cymel 1170, Cymel 370, Cymel 771, Cymel 272, Cymel 1172, Cymel 325, Cymel 327, Cymel 703, Cymel 712, Cymel 254, Cymel 253, Cymel 212, Cymel 1128, Cymel 701, Cymel 202, and Cymel 207 (manufactured by Nihon Cytec Industries, Inc.), Nikalac MW-30M, Nikalac MW-30, Nikalac MW-22, Nikalac MW-24X, Nikalac MS-21, Nikalac MS-11, Nikalac MS-001, Nikalac MX-002, Nikalac MX-730, Nikalac MX-750, Nikalac MX-708, Nikalac MX-706, Nikalac MX-042, Nikalac MX-035, Nikalac MX-45, Nikalac MX-410, Nikalac MX-302, Nikalac MX-202, Nikalac SM-651, Nikalac SM-652, Nikalac SM-653, Nikalac SM-551, Nikalac SM-451, Nikalac SB-401, Nikalac SB-355, Nikalac SB-303, Nikalac SB-301, Nikalac SB-255, Nikalac SB-203, Nikalac SB-201, Nikalac BX-4000, Nikalac BX-37, Nikalac BX-55H, and Nikalac BL-60 (manufactured by Sanwa Chemical Co., Ltd.), Aron Oxetane OXT-101, Aron Oxetane OXT-121, Aron Oxetane OXT-221 (manufactured by Toagosei Co., Ltd.), OXTP and OXBP (manufactured by Ube Industries, Ltd.), and the like can be given. Among these, Cymel 325, Cymel 327, Cymel 703, Cymel 712, Cymel 254, Cymel 253, Cymel 212, Cymel 1128, Cymel 701, Cymel 202, and Cymel 207 which are the compounds of the general formula (1) in which either $R^1$ or $R^2$ is a hydrogen atom (i.e., compounds having an imino group) are preferable.

As specific examples of the crosslinking component II, compounds having an epoxycyclohexyl group such as 3,4-epoxycyclohexylmethyl-3',4'-epoxycyclohexanecarboxylate, 2-(3,4-epoxycyclohexyl-5,5-spiro-3,4-epoxy)cyclohexane-meta-dioxane, bis(3,4-epoxycyclohexylmethyl)adipate, bis(3,4-epoxy-6-methylcyclohexylmethyl)adipate, 3,4-epoxy-6-methylcyclohexyl-3',4'-epoxy-6'-methylcyclohexa necarboxylate, methylenebis(3,4-epoxycyclohexane), ethylene glycol di(3,4-epoxycyclohexylmethyl)ether, ethylenebis (3,4-epoxycyclohexanecarboxylate), ε-caprolactone-modified 3,4-epoxycyclohexylmethyl-3',4'-epoxycyclohexanecarboxylate, trimethylcaprolactone-modified 3,4-epoxycyclohexylmethyl-3',4'-epoxycyclohexanecarboxylate, and β-methyl-δ-valerolactone-modified 3,4-epoxycyclohexylmethyl-3',4'-epoxycyclohexanecarboxylate;

bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ethers; polydiglycidyl ethers of polyether polyol obtained by adding one or more alkylene oxides to an aliphatic polyhydric alcohol such as ethylene glycol, propylene glycol, and glycerol; diglycidyl esters of an aliphatic long-chain dibasic acid;

monodiglycidyl ethers of an aliphatic higher alcohol; monodiglycidyl ethers of phenol, cresol, or butyl phenol, or a polyether alcohol obtained by adding an alkylene oxide to the phenol, cresol, or butyl phenol; glycidyl esters of a higher fatty acid;

oxetane compounds having two or more oxetane rings in the molecule such as 3,7-bis(3-oxetanyl)-5-oxa-nonane, 3,3'-(1, 3-(2-methylenyl)propanediylbis(oxymethylene))bis-(3-ethyloxetane), 1,4-bis[(3-ethyl-3-oxetanylmethoxy)methyl] benzene, 1,2-bis[(3-ethyl-3-oxetanylmethoxy)methyl] ethane, 1,3-bis[(3-ethyl-3-oxetanylmethoxy)methyl] propane, ethylene glycol bis(3-ethyl-3-oxetanylmethyl) ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3- oxetanylmethyl)ether, ditrimethylolpropane tetrakis(3-ethyl-3-oxetanylmethyl)ether, ethylene oxide(EO)-modified bisphenol A bis(3-ethyl-3-oxetanylmethyl)ether, propylene oxide(PO)-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, EO-modified bisphenol F bis(3-ethyl-3-oxetanylmethyl)ether, and the like can be given.

Of these, 1,6-hexanediol diglycidyl ether and dipentaerythritol hexakis(3-ethyl-3-oxetanylmethyl)ether are preferable as the crosslinking component II. These crosslinking components may be used either individually or in combination of two or more.

When the crosslinking component is contained in the resin composition of the present invention, the content of the crosslinking component is preferably 1 to 100 parts by mass, more preferably 5 to 50 parts by mass, and particularly preferably 5 to 30 parts by mass for 100 parts by mass of the hydroxyl group-containing resin. If the content is less than 1 part by mass, the resin composition is cured only inadequately and may not cause pattern shrinkage. If more than 100 parts by mass, on the other hand, there is a possibility that a pattern is buried due to excessive curing.

The total amount of the hydroxyl group-containing resin and the crosslinking component in the resin composition including the non-aqueous solvent and alcohol solvent is preferably 0.1 to 30 mass %, and more preferably 1 to 20 mass %. If the total amount of the hydroxyl group-containing resin and the crosslinking component is less than 0.1 mass %, the coating is too thin to prevent cutting at pattern edges. When the content is more than 30 mass %, the viscosity is too high to bury a fine pattern.

(Surfactant)

A surfactant may be added to the resin composition of the present invention in order to increase applicability, defoamability, leveling properties, and the like. As specific examples of the surfactant, commercially available fluorine-containing surfactants such as BM-1000, BM-1100 (manufactured by BM Chemie), Megafac F142D, F172, F173, F183 (manufactured by Dainippon Ink and Chemicals, Inc.), Fluorad FC-135, FC-170C, FC-430, FC-431 (manufactured by Sumitomo 3M, Ltd.), Surflon S-112, S-113, S-131, S-141, S-145 (manufactured by Asahi Glass Co., Ltd.), SH-28PA, SH-190, SH-193, SZ-6032, SF-8428 (manufactured by Toray-Dow Corning Silicone Co., Ltd.), and the like can be given. The amount of the surfactant to be added is preferably 5 parts by mass or less for 100 parts by mass of the hydroxyl group-containing resin.

2. Pattern Forming Method (Step (1))

In the step (1), the first resist agent is applied to a substrate (e.g., a silicon wafer or a wafer covered with SiN, an organic antireflection film, or the like) using an appropriate application method such as rotational coating, cast coating, or roll coating. A first resist layer of the first resist agent can be formed in this manner. After applying the first resist agent, the coating may be optionally prebaked (PB) to vaporize the solvent. The prebaking temperature is usually about 30 to 200° C., and preferably 50 to 150° C., although the prebaking conditions are changed according to the composition of the first resist agent.

In order to bring out the potential of the first resist agent to the maximum extent, it is preferable to form an organic or inorganic antireflection film on the substrate, as disclosed in JP-B-6-12452, for example. It is also preferable to provide a protective film on the first resist layer in order to prevent an adverse effect of basic impurities and the like that are present in the environmental atmosphere (see JP-A-5-188598, for example). It is preferable to form both of the antireflection film and the protective film.

A given area of the first resist layer is exposed by applying radiation or the like through a mask with a specific pattern to form a latent pattern image area (i.e., an area that has been made insoluble in alkali by exposure). As radiation used for exposure, visible rays, ultraviolet rays, deep ultraviolet rays, X-rays, electron beams, or the like are appropriately selected depending on the type of the acid generator contained in the first resist agent. It is preferable to use deep ultraviolet rays represented by an ArF excimer laser (wavelength: 193 nm) or a KrF excimer laser (wavelength: 248 nm). An ArF excimer laser (wavelength: 193 nm) is particularly preferable. The exposure conditions (e.g., exposure amount) are appropriately determined depending on the composition of the first resist agent, the type of additive, and the like. In the present invention, it is preferable to perform post-exposure bake (PEB) after exposure. PEB ensures a smooth dissociation reaction of the acid-dissociable group contained in the resin. The PEB temperature is usually 30 to 200° C., and preferably 50 to 170° C., although the PEB conditions are changed according to the composition of the resin composition.

The exposed first resist layer is developed so that the latent pattern image area is exposed to form a positive-tone first resist pattern 1 with a predetermined line width $L_1$ having a predetermined space area on a substrate 10, as shown in FIG. 1. The line width $L_1$ of the first pattern 1 varies according to the type of radiation and the like. For example, when using an ArF excimer laser (wavelength: 193 nm), the line width $L_1$ is 95 to 155 nm.

As the developer used for development, it is preferable to use an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water. The concentration of the alkaline aqueous solution is usually 10 mass % or less. If the concentration of the alkaline aqueous solution exceeds 10 mass %, an unexposed area may be dissolved in the developer. After development using the alkaline aqueous solution, the resist film is generally washed with water, and dried.

An organic solvent may be added to the alkaline aqueous solution (developer). As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given. These organic solvents may be used either individually or in combination of two or more.

The organic solvent is preferably added in an amount of 100 parts by volume or less based on 100 parts by volume of the alkaline aqueous solution. If the amount of the organic solvent exceeds 100 parts by volume based on 100 parts by volume of the alkaline aqueous solution, developability may decrease so that the exposed area may remain undeveloped.

An appropriate amount of a surfactant or the like may also be added to the developer.

(Step (2))

Figure 2:
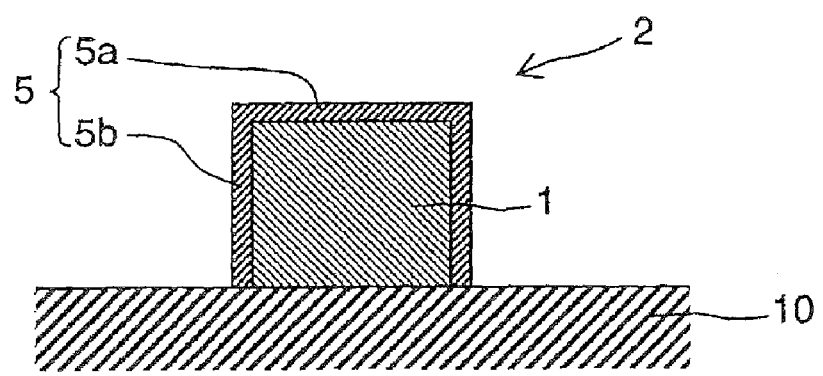
FIG. 2 is a cross-sectional view schematically showing an example of the second pattern.

In the step (2), the resin composition according to one embodiment of the present invention is applied to the first pattern using an appropriate application method such as rotational coating, cast coating, or roll coating. In this instance, the resin composition is applied to cover the first pattern. After applying the resin composition, the coating is baked. The resin composition of the present invention applied to the first pattern preferably contains a resin which has reactivity with the first positive-tone radiation-sensitive resin composition, and becomes insoluble or scarcely soluble in the developer when baked. Therefore, the heat treatment forms an area that is insoluble or scarcely soluble in the developer on the first pattern. After cooling as appropriate, the resulting product is washed with the same developer as used in the step (1) to obtain a second pattern 2 in which the surface of the first pattern 1 is covered with a covering layer 5 which is formed of the resin composition and has an upper covering part 5a and a side covering part 5b, as shown in FIG. 2. The second pattern 2 is insoluble or scarcely soluble in the developer and a second resist agent described later when the second resist agent is used. The step (2) may be carried out two or more times, as required. After development, a heat treatment (baking) may be carried out two or more times, as required.

The heating temperature when heating the resin composition applied to the first pattern is usually 30 to 200° C., and preferably 50 to 170° C., although the heating conditions are changed according to the composition of the resin composition. When using a resin composition containing the above-mentioned crosslinking component, the heating temperature is appropriately determined according to the amount of the crosslinking component. For example, when using a resin composition containing 10 to 20 parts by mass of the crosslinking component based on 100 parts by mass of the hydroxyl group-containing resin, the heating temperature is preferably 100 to 170° C., and more preferably 140 to 160° C., although the heating temperature varies according to the type of the crosslinking component. If the heating temperature is less than 90° C., insolubilization of the resin in the developer tends to be insufficient. If the heating temperature is more than 180° C., the third pattern tends to collapse. When using a resin composition containing 20 to 30 parts by mass of the crosslinking component based on 100 parts by mass of the hydroxyl group-containing resin, the heating temperature is preferably 100 to 170° C., and more preferably 130 to 150° C., although the heating temperature varies according to the type of the crosslinking component. If the heating temperature is less than 90° C., insolubilization of the resin in a developer tends to be insufficient. If the heating temperature is more than 180° C., the third pattern tends to collapse.

(Step (3))

Figure 3:
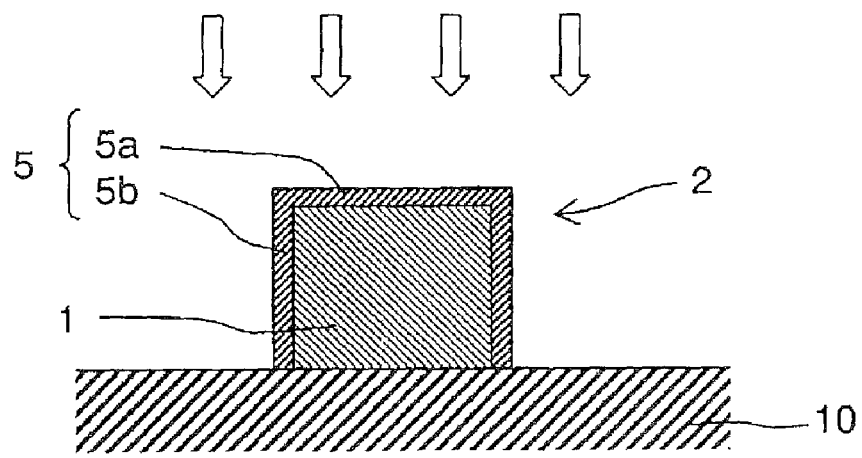
FIG. 3 is a cross-sectional view schematically showing an example of exposing the second pattern to radiation.
Figure 4:
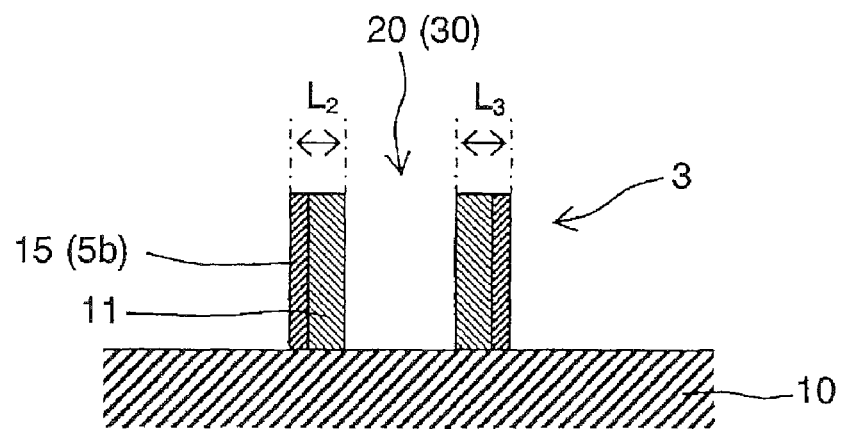
FIG. 4 is a cross-sectional view schematically showing an example of the third pattern.

In the step (3), the entire second pattern 2 formed on the substrate 10 is exposed to predetermined radiation, as shown in FIG. 3. The second pattern 2 may be selectively exposed through a mask. After exposure, a heat treatment (PEB) may be carried out, as required. The resist pattern is developed in the same manner as in the step (1) to obtain a third pattern 3 in which a hole 20 (and/or a groove 30) is formed by separation of the second pattern 2, as shown in FIG. 4. Although the principle of this phenomenon is not clear, part of the second pattern becomes soluble in the developer by exposure. The upper covering part 5a of the covering layer 5 and at least part of the first pattern 1 are removed by development (see FIG. 3) to form a third pattern 3 that has predetermined line widths $L_2$ and $L_3$ and has a first pattern residue 11 and a residual covering layer residue 15 corresponding to the side covering part 5b.

The line widths $L_2$ and $L_3$ of the third pattern 3 obtained in this manner are smaller than the line width $L_1$ of the first pattern 1 (see FIG. 1). Specifically, it is possible for the line widths $L_2$ and $L_3$ to be 33 to 55 nm when the line width $L_1$ is 95 to 155 nm, for example. According to the pattern forming method of the present invention, a fine pattern with a line width of 35 to 55 nm, of which the formation has been extremely difficult, can be easily formed by the exposure method using an ArF excimer laser without using expensive equipment such as a liquid immersion exposure apparatus. Therefore, the pattern forming method of the present invention can preferably be employed in a semiconductor manufacturing process, and is extremely useful.

Figure 5:
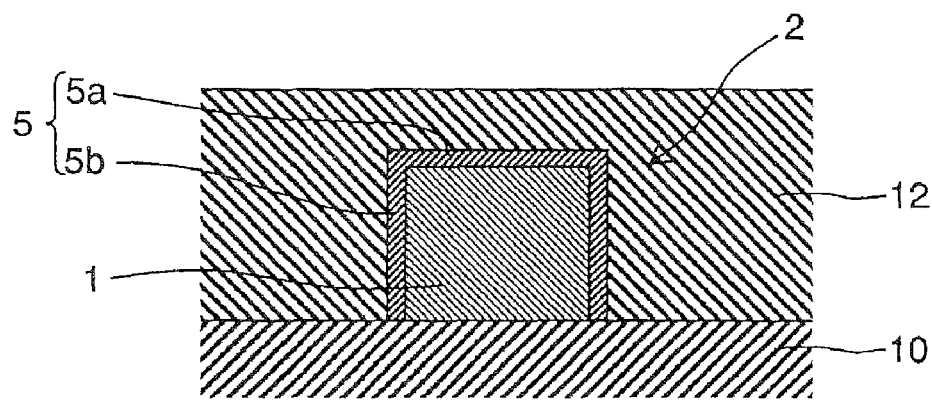
FIG. 5 is a cross-sectional view schematically showing an example of the second resist layer formed on the second pattern.
Figure 6:
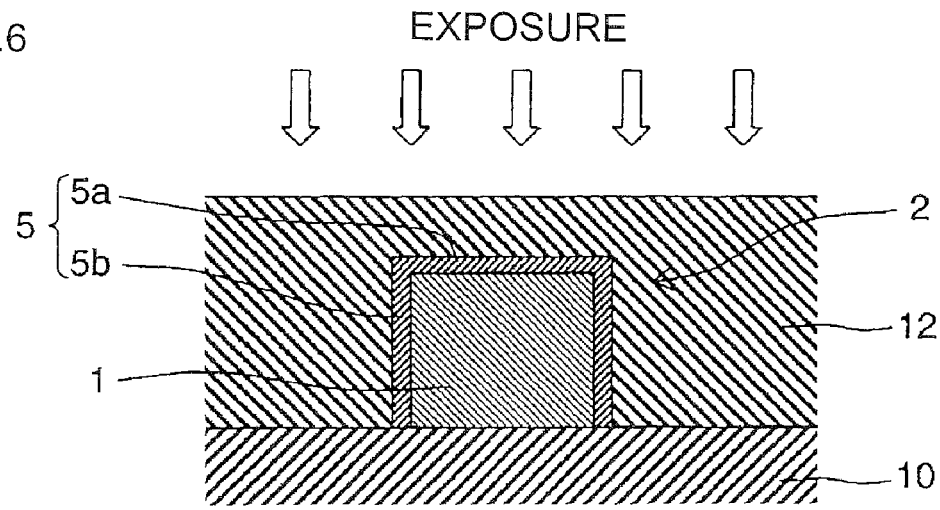
FIG. 6 is a cross-sectional view schematically showing another example of exposing the second pattern to radiation.

In the pattern forming method of the present invention, as shown in FIG. 5, it is desirable to apply the second resist agent to the second pattern 2 to form a second resist layer 12 a second resist layer 12 by baking in the same manner as in the step (1) after the step (2), but before the step (3). Since the thickness and the height of the third pattern can be appropriately adjusted by utilizing the second resist agent, it is possible to suppress failures such as collapse of the third pattern. An appropriate method such as rotational coating, cast coating, or roll coating can be used without particular limitations for applying the second resist agent to the second pattern 2. After forming the second resist layer 12, the step (3) is carried out. As shown in FIG. 6, the second resist layer 12 and the second pattern 2 are entirely exposed by applying predetermined radiation so that the second resist layer 12 and the second pattern 2 become partly soluble in the developer. In this instance, the second resist layer 12 and the second pattern 2 may be selectively exposed through a mask, as required. After exposure, a heat treatment (PEB) may be carried out, as required.

Figure 7:
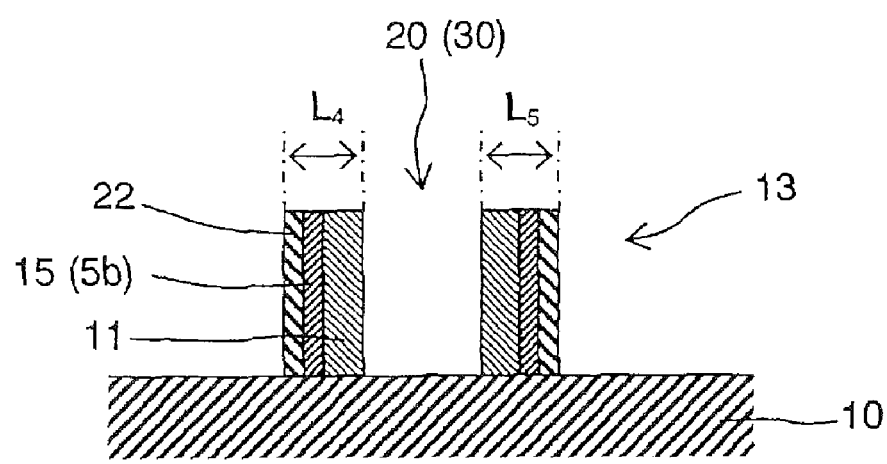
FIG. 7 is a cross-sectional view schematically showing another example of the third pattern.

After exposure, the resist pattern is developed in the same manner as in the step (1) to obtain a third pattern 13 in which a hole 20 (and/or a groove 30) is formed by separation of the second pattern 2, as shown in FIG. 7. Although the principle of this phenomenon is not clear, the upper covering part 5a of the covering layer 5 and at least a part of the first pattern 1 are removed by exposure and development (see FIG. 6) to form a third pattern 13 with a predetermined line width $L_4$ and $L_5$ having a first pattern residue 11 and a residual covering layer 15 corresponding to the side covering part 5b. The line widths $L_4$ and $L_5$ of the third pattern 13 obtained in this manner are smaller than the line width $L_1$ of the first pattern 1 (see FIG. 1) in the same manner as the line widths $L_2$ and $L_3$ of the third pattern 3 shown in FIG. 4.

In the pattern forming method of the present invention, in order to easily form a hole or a groove in the second pattern to obtain the third pattern, it is preferable to remove the surface layer of the second pattern 2 (see FIG. 2) by etching (etching step) or by treating with a solvent (solvent removing step) after the step (2) but before the step (3), or to add the etching step or the solvent removing step after the step (3). In the etching step, the surface layer of the second pattern may be removed by etching using $CF_4$ gas or $O_2$ gas using general etching equipment. In the solvent removing step, the surface layer of the second pattern may be removed by applying a predetermined solvent onto the second pattern using an appropriate application method such as rotational coating, cast coating, and roll coating. As the solvent used in the solvent removing step, propylene glycol monomethyl ether acetate, γ-butyrolactone, cyclohexanone, and the like can be given.

(Positive-Tone Radiation-Sensitive Resin Composition)

The first resist agent and the second resist agent (positive-tone radiation-sensitive resin composition (positive-tone resist agent)) used in the pattern forming method of the present invention are both of the type in which an acid-dissociable group in the resin dissociates by the action of an acid which is generated from the acid generating component upon exposure and, as a result, solubility of the exposed part of the resist in an alkaline developer increases, whereby the exposed part is dissolved in an alkaline developer and removed to provide a positive-tone resist pattern.

It is desirable that either the first resist agent or the second resist agent or both of them contain a resin having a repeating unit shown by the following general formula (1) (such a resin is hereinafter referred to from time to time as "resist agent resin"),

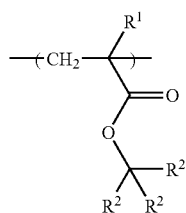

(1)

wherein $R^1$ represents a hydrogen atom or a methyl group, and $R^2$s individually represent a monovalent alicyclic hydrocarbon group having 4 to 20 carbon atoms or a derivative thereof, or a linear or branched alkyl group having 1 to 4 carbon atoms, (i) at least one of the $R^2$s is a monovalent alicyclic hydrocarbon group having 4 to 20 carbon atoms or a derivative thereof, or (ii) any two of the $R^2$s form a divalent alicyclic hydrocarbon group having 4 to 20 carbon atoms or a derivative thereof together with the carbon atom to which each $R^2$ bonds with the remaining $R^2$ being a linear or branched alkyl group having 1 to 4 carbon atoms, a monovalent alicyclic hydrocarbon group having 4 to 20 carbon atoms, or a derivative thereof.

As examples of the monovalent alicyclic hydrocarbon group having 4 to 20 carbon atoms represented by $R^2$ in the general formula (1) or any divalent alicyclic hydrocarbon group having 4 to 20 carbon atoms formed by bonding of any two of the $R^{2s}$, groups containing an alicyclic ring derived from cycloalkanes such as norbornane, tricyclodecane, tetracyclododecane, adamantane, cyclobutane, cyclopentane, cyclohexane, cycloheptane, and cyclooctane; groups in which the above group containing an alicyclic ring is substituted with at least one of linear, branched, or cyclic alkyl groups having 1 to 4 carbon atoms such as a methyl group, an ethyl group, an n-propyl group, an i-propyl group, an n-butyl group, a 2-methylpropyl group, a 1-methylpropyl group, and a t-butyl group; and the like can be given. Of these, an alicyclic group derived from norbornane, tricyclodecane, tetracyclododecane, adamantane, cyclopentane, or cyclohexane and a group in which such an alicyclic ring is substituted with any one of the above alkyl groups are preferable.

As specific examples of the derivatives of the monovalent alicyclic hydrocarbon groups having 4 to 20 carbon atoms shown by $R_2$ in the general formula (1), groups having at least one substituent such as a hydroxyl group; a carboxyl group; an oxo group (=O); a hydroxyalkyl group having 1 to 4 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, and a 4-hydroxybutyl group; an alkoxy group having 1 to 4 carbon atoms such as a methoxy group, an ethoxy group, an n-propoxy group, an i-propoxy group, an n-butoxy group, a 2-methylpropoxy group, a 1-methylpropoxy group, and a t-butoxy group; a cyano group; and a cyanoalkyl group having 2 to 5 carbon atoms such as a cyanomethyl group, a 2-cyanoethyl group, a 3-cyanopropyl group, and a 4-cyanobutyl group can be given. Of these, a hydroxyl group, a carboxyl group, a hydroxymethyl group, a cyano group, a cyanomethyl group, are preferable.

As specific examples of the linear or branched alkyl group having 1 to 4 carbon atoms represented by $R^2$ in the general formula (1), a methyl group, an ethyl group, an n-propyl group, an i-propyl group, an n-butyl group, a 2-methylpropyl group, a 1-methylpropyl group, and a t-butyl group can be given. Among these, a methyl group and an ethyl group are preferable.

As specific examples the group shown by formula —$C(R^2)_3$ in the general formula (1), groups shown by the general formulas (1a) to (1f) can be given.

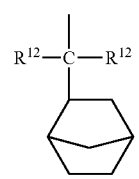

(1a)

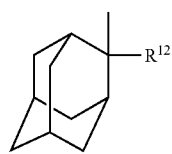

(1b)

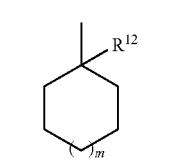

(1c)

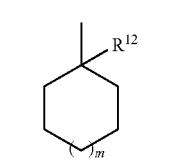

(1d)

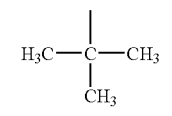

(1e)

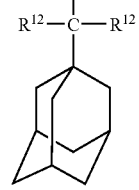

(1f)

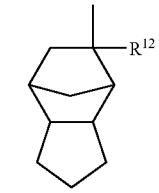

In the above general formulas (1a) to (1f), $R^{12}$ individually represents a linear or branched alkyl group having 1 to 4 carbon atoms and m is 0 or 1. As specific examples of the linear or branched alkyl group having 1 to 4 carbon atoms, a methyl group, an ethyl group, an n-propyl group, an i-propyl group, an n-butyl group, a 2-methylpropyl group, a 1-methylpropyl group, a t-butyl group, and the like can be given. Among these, a methyl group and an ethyl group are preferable.

The part shown by the group —COOC(R$^2$)$_3$ in the general formula (1) dissociates by the action of an acid and forms a carboxyl group to become an alkali-soluble part. The term "alkali-soluble part" refers to an (alkali-soluble) group which becomes anion by the action of an alkali. The term "acid-dissociable group" refers to a group in which the alkali-soluble part is protected by a blocking group and is not alkali-soluble until the blocking group is dissociated by an acid.

The resist agent resin itself is insoluble or scarcely soluble in alkali, but becomes alkali-soluble by the action of an acid. The term "alkali-soluble or scarcely alkali-soluble" refers to the properties of a resin of maintaining 50% or more of an initial film thickness when a film made only from the resin containing the repeating unit shown by the above general formula (1) is treated (without exposing to radiation) under the developing conditions applied to pattern formation using a resist layer comprising the resist agent containing the repeating unit shown by the above general formula (1). The term "alkali-soluble" means the properties in which 50% or more of the initial film thickness of the film is lost when treated in the same manner.

The polystyrene-reduced weight average molecular weight (Mw) of the resist agent resin determined by gel permeation chromatography (GPC) is usually 1000 to 500,000, preferably 1000 to 100,000, and more preferably 1000 to 50,000. If the Mw is less than 1000, heat resistance of the formed pattern tends to decrease. If more than 500,000, on the other hand, developability tends to decrease. The ratio (Mw/Mn) of the Mw to the polystyrene-reduced number average molecular weight (Mn) determined by GPC of the resist agent resin is preferably 1 to 5, and more preferably 1 to 3. The content of low molecular weight components containing monomers as the major component in the resist agent resin is preferably not more than 0.1 mass %, on a solid basis, of the total amount of the resist agent resin. The content of low molecular weight components may be measured by high performance liquid chromatography (HPLC), for example.

(Preparation Method of Resist Agent Resin)

The resist agent resin is prepared by polymerizing a monomer component containing a polymerizable unsaturated monomer corresponding to a desired repeating unit in an appropriate solvent in the presence of a chain transfer agent, as required, using a radical polymerization initiator such as hydroperoxides, dialkyl peroxides, diacyl peroxides, or azo compounds.

As examples of the solvent used for polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, and diethoxyethanes; alcohols such as methanol, ethanol, 1-propanol, 2-propanol, 1-butanol, 2-butanol, isobutanol, 1-pentanol, 3-pentanol, 4-methyl-2-pentanol, o-chlorophenol, and 2-(1-methylpropyl)phenol; and ketones such as acetone, 2-butanone, 3-methyl-2-butanone, 4-methyl-2-pentanone, 2-heptanone, cyclopentanone, cyclohexanone, and methylcyclohexanone; and the like can be given. These solvents may be used either individually or in combination of two or more.

The polymerization reaction temperature is usually 40 to 150° C., and preferably from 50 to 120° C. The reaction time is usually 1 to 48 hours, and preferably 1 to 24 hours. It is preferable that the resist agent resin obtained contain almost no impurities such as halogens and metals. The smaller the amount of impurities, the better the sensitivity, resolution, process stability, and pattern profile. The resist agent resin may be purified by a chemical purification method (e.g., washing with water or liquid-liquid extraction) or a combination of the chemical purification method and a physical purification method (e.g., ultrafiltration or centrifugation), for example.

(Photoacid Generator)

The positive-tone resist agent of the present invention preferably comprises an acid generator decomposed by exposure having a structure shown by the following general formula (6),

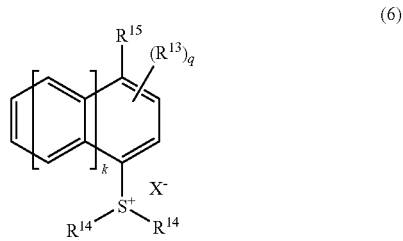

(6)

wherein R$^{15}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, R$^{13}$ represents a linear or branched alkyl group having 1 to 10 carbon atoms, a linear, branched alkoxy group having 1 to 10 carbon atoms, or a linear, branched, or cyclic alkanesulfonyl group having 1 to 10 carbon atoms, R$^{14}$ individually represents a linear or branched alkyl group having 1 to 10 carbon atoms, a substituted or unsubstituted phenyl group, a substituted or unsubstituted naphthyl group, or two R$^{14}$s may bond to form a divalent group having 2 to 10 carbon atoms which may be either substituted or unsubstituted, k represents an integer of 0 to 2, X$^-$ indicates an anion of the general formula R$^{16}$C$_n$F$_{2n}$SO$_3^-$ (wherein R$^{16}$ is a fluorine atom or a substituted or unsubstituted hydrocarbon group having 1 to 12 carbon atoms), and q represents an integer of 0 to 10.

As examples of the linear or branched alkyl group having 1 to 10 carbon atoms for R$^{13}$, R$^{14}$, or R$^{15}$ in the general formula (6), a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, an n-heptyl group, an n-octyl group, a 2-ethylhexyl group, an n-nonyl group, an n-decyl group, and the like can be given. Of these, a methyl group, an ethyl group, an n-butyl group, a t-butyl group, and the like are preferable.

Examples of the linear or branched alkoxy group having 1 to 10 carbon atoms represented by R$^{13}$ and R$^{14}$ in the above general formula (6) include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, and an n-decyloxy group. Of these, a methoxy group, an ethoxy group, an n-propoxy group, an n-butoxy group, and the like are preferable.

Examples of the linear or branched alkoxycarbonyl group having 2 to 11 carbon atoms represented by $R^{15}$ in the above general formula (6) include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, a n-nonyloxycarbonyl group, and an n-decyloxycarbonyl group. Of these, a methoxycarbonyl group, an ethoxycarbonyl group, an n-butoxycarbonyl group, and the like are preferable.

As examples of the linear, branched, or cyclic alkanesulfonyl group having 1 to 10 carbon atoms represented by $R^{13}$ in the above general formula (6), a methanesulfonyl group, an ethanesulfonyl group, an n-propanesulfonyl group, an n-buthanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, and a cyclohexanesulfonyl group can be given. Of these, a methanesylfonyl group, an ethanesulfonyl group, an n-propanesulfonyl group, an n-butanesulfonyl group, a cyclopentanesulfonyl group, and a cyclohexanesulfonyl group are preferable. q is preferably 0 to 2.

Examples of the substituted or unsubstituted phenyl group $R^{14}$ in the general formula (6) include a phenyl group, phenyl groups substituted with a linear, branched, or cyclic alkyl group having 1 to 10 carbon atoms such as an o-tolyl group, an m-tolyl group, a p-tolyl group, a 2,3-dimethylphenyl group, a 2,4-dimethylphenyl group, a 2,5-dimethylphenyl group, a 2,6-dimethylphenyl group, a 3,4-dimethylphenyl group, a 3,5-dimethylphenyl group, a 2,4,6-trimethylphenyl group, a 4-ethylphenyl group, a 4-t-butylphenyl group, 4-cyclohexylphenyl group, and a 4-fluorophenyl group; and groups obtained by substituting the phenyl group or the alkyl-substituted phenyl group with at least one group such as a hydroxyl group, a carboxyl group, a cyano group, a nitro group, an alkoxy group, an alkoxyalkyl group, an alkoxycarbonyl group, or an alkoxycarbonyloxy group.

Examples of the alkoxy group as the substituent for the phenyl group or the alkyl-substituted phenyl group include linear, branched, or cyclic alkoxy groups having 1 to 20 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include linear, branched, or cyclic alkoxyalkyl groups having 2 to 21 carbon atoms such as a methoxymethyl group, an ethoxymethyl group, a 1-methoxyethyl group, a 2-methoxyethyl group, a 1-ethoxyethyl group, and a 2-ethoxyethyl group. Examples of the alkoxycarbonyl group include linear, branched, or cyclic alkoxycarbonyl groups having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the alkoxycarbonyloxy group include linear, branched, or cyclic alkoxycarbonyloxy groups having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyl group, and a cyclohexyloxycarbonyl group. Preferable phenyl groups which may have a substituent represented by $R^{14}$ in the general formula (6) are a phenyl group, a 4-cyclohexylphenyl group, a 4-t-butylphenyl group, a 4-methoxyphenyl group, and a 4-t-butoxyphenyl group.

Examples of the substituted or unsubstituted naphthyl group represented by $R^{14}$ in the above general formula (6) include naphthyl groups substituted with a linear, branched, or cyclic alkyl group having 1 to 10 carbon atoms such as a naphthyl group, a 1-naphthyl group, a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group; and a group obtained by substituting the naphthyl group or the alkyl-substituted naphthyl group with at least one group such as a hydroxyl group, a carboxyl group, a cyano group, a nitro group, an alkoxy group, an alkoxyalkyl group, an alkoxycarbonyl group, or an alkoxycarbonyloxy group. As specific examples of the alkoxy group, alkoxyalkyl group, alkoxycarbonyl group, and alkoxycarbonyloxy group which are the substituents, the groups illustrated for the phenyl group and the alkyl-substituted phenyl groups can be given.

As the naphtyl group which may have a substituent represented by $R^{14}$ in the above general formula (6), a 1-naphthyl group, a 1-(4-methoxynaphthyl) group, a 1-(4-ethoxynaphthyl) group, a 1-(4-n-propoxynaphtyl) group, a 1-(4-n-butoxynaphthyl) group, a 2-(7-methoxynaphtyl) group, a 2-(7-ethoxynaphtyl) group, a 2-(7-n-propoxynaphtyl) group, a 2-(7-n-butoxynaphtyl) group, and the like can be given.

As an example of the divalent group having 2 to 10 carbon atoms formed by two $R^{14}$ groups in the above general formula (6), a group forming a five or six member ring, preferably a five member ring (i.e., tetrahydrothiophene ring), together with the sulfur atom in the general formula (6), is preferable. As examples of the substituent for the above divalent groups, the groups previously mentioned for the phenyl group and alkyl-substituted phenyl groups, such as a hydroxyl group, a carboxyl group, a cyano group, a nitro group, an alkoxy group, an alkoxyalkyl group, an alkoxycarbonyl group, and an alkoxycarbonyloxy group can be given. As the group $R^{14}$ in the above general formula (6), a methyl group, an ethyl group, a phenyl group, a 4-methoxyphenyl group, and a 1-naphthyl group are preferable. The $R^{14}$ may also be a divalent group, in which case two of the divalent groups form a tetrahydrothiophene cyclic structure together with the sulfur atom.

As examples of the cation moiety in the general formula (6), a triphenylsulfonium cation, a tri-1-naphthylsulfonium cation, a tri-tert-butylphenylsulfonium cation, a 4-fluorophenyl-diphenylsulfonium cation, a di-4-fluorophenyl-phenylsulfonium cation, a tri-4-fluorophenylsulfonium cation, a 4-cyclohexylphenyl-diphenylsulfonium cation, a 4-methanesulfonylphenyl-diphenylsulfonium cation, a 4-cyclohexanesulfonyl-diphenylsulfonium cation, a 1-naphthyldimethylsulfonium cation, a 1-naphthyldiethylsulfonium cation, a 1-(4-hydroxynaphthyl)dimethylsulfonium cation, a 1-(4-methylnaphthyl)dimethylsulfonium cation, a 1-(4-methylnaphthyl)diethylsulfonium cation, a 1-(4-cyanonaphthyl)dimethylsulfonium cation, a 1-(4-cyanonaphthyl)diethylsulfonium cation, a 1-(3,5-dimethyl-4-hydroxyphenyl)tetrahydrothiophenium cation, a 1-(4-methoxynaphthyl)tetrahydrothiophenium cation, a 1-(4-ethoxynaphthyl)tetrahydrothiophenium cation, a 1-(4-n-propoxynaphthyl) tetrahydrothiophenium cation, a 1-(4-n-butoxynaphthyl) tetrahydrothiophenium cation, a 2-(7-methoxynaphthyl) tetrahydrothiophenium cation, a 2-(7-ethoxynaphthyl) tetrahydrothiophenium cation, a 2-(7-n-propoxynaphthyl) tetrahydrothiophenium cation, a 2-(7-n-butoxynaphthyl) tetrahydrothiophenium cation, and the like can be given.

The —$C_nF_{2n}$- group in the anion of the general formula $R^{16}C_nF_{2n}SO_3^-$ represented by X⁻ in the general formula (6) is a perfluoroalkyl group having carbon atoms of the number n. This perfluoroalkyl group is either linear or branched. n is preferably 1, 2, 4, or 8. As a hydrocarbon group having 1 to 12 carbon atoms which may have a substituent represented by $R^{16}$, a cycloalkyl group, a bridge alicyclic hydrocarbon group, or an alkyl group having 1 to 12 carbon atoms are preferable. As specific examples, a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, an adamantyl group, and the like can be given.

As examples of a preferable anion moiety in the general formula (6), a trifluoromethanesulfonate anion, a perfluoro-n-butanesulfonate anion, a perfluoro-n-octanesulfonate anion, a 2-bicyclo[2.2.1]hept-2-yl-1,1,2,2-tetrafluoroethanesulfonate anion, a 2-bicyclo[2.2.1]hept-2-yl-1,1-difluoroethanesulfonate anion, and the like can be given.

The above-described acid generators may be used either individually or in combination of two or more. Acid generators other than the above acid generators (hereinafter referred to as "other acid generators") can also be used. As specific examples of the other acid generators, onium salts, halogen-containing compounds, diazoketone compounds, sulfone compounds, and sulfonate compounds can be given.

As examples of the onium salt compounds, iodonium salts, sulfonium salts, phosphonium salts, diazonium salts, pyridinium salts, and the like can be given. As specific examples of the onium salt compounds, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hepta-2-yl-1,1,2,2-tetrafluoroethanesulfonate, bis(4-t-butylphenyl) iodonium trifluoromethanesulfonate, bis(4-t-butylphenyl) iodonium nonafluoro-n-butanesulfonate, bis(4-t-butylphenyl)iodonium perfluoro-n-octanesulfonate, bis(4-t-butylphenyl)iodonium 2-bicyclo[2.2.1]hepta-2-yl-1,1,2,2-tetrafluoroethanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, and the like can be given.

As examples of the halogen-containing compounds, haloalkyl group-containing hydrocarbon compounds, haloalkyl group-containing heterocyclic compounds, and the like can be given. As specific examples of the halogen-containing compound, (trichloromethyl)-s-triazine derivatives such as phenylbis(trichloromethyl)-s-triazine, 4-methoxyphenylbis(trichloromethyl)-s-triazine, 1-naphthylbis(trichloromethyl)-s-triazine, 1,1-bis(4-chlorophenyl)-2,2,2-trichloroethane, and the like can be given.

As examples of the diazoketone compounds, 1,3-diketo-2-diazo compounds, diazobenzoquinone compounds, diazonaphthoquinone compounds, and the like can be given. As specific examples of the diazoketone compound, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate or 1,2-naphthoquinonediazido-5-sulfonate of 1,1,1-tris(4-hydroxyphenyl)ethane can be given.

As examples of the sulfone compounds, β-ketosulfone, β-sulfonylsulfone, α-diazo compounds of these compounds, and the like can be given. As specific examples of the sulfone compound, 4-trisphenacylsulfone, mesitylphenacylsulfone, bis(phenylsulfonyl)methane, and the like can be given.

As examples of sulfonate compounds, alkyl sulfonate, alkylimide sulfonate, haloalkyl sulfonate, aryl sulfonate, imino sulfonate, and the like can be given. As specific examples of the sulfonate compounds, benzointosylate, tris (trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hepta-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hepta-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like can be given.

Among these other acid generators, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hepta-2-yl-1,1,2,2-tetrafluoroethanesulfonate, bis(4-t-butylphenyl) iodonium trifluoromethanesulfonate, bis(4-t-butylphenyl) iodonium nonafluoro-n-butanesulfonate, bis(4-t-butylphenyl)iodonium perfluoro-n-octanesulfonate, bis(4-t-butylphenyl)iodonium 2-bicyclo[2.2.1]hepta-2-yl-1,1,2,2-tetrafluoroethanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hepta-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo [2.2.1]hept-2-yl-1,1,2,2-tetrafluoroethanesulfonyloxy)succinimide, 1,8-naphthalenedicarboxylic acid imide trifluoromethanesulfonate, and the like are preferable. These other acid generators may be used either individually or in combination of two or more.

Combined use of the acid generator having a structure shown by the above general formula (6) and the other acid generators is also preferable. When the other acid generators are used in combination, the proportion of the other acid generators is usually 80 mass % or less, and preferably 60 mass % or less of the total amount of the acid generators having a structure shown by the general formula (6) and the other acid generators.

The total amount of the acid generators contained in the positive-tone resist agents is usually 0.1 to 20 parts by mass, and preferably 0.5 to 10 parts by mass for 100 parts by mass of the resist agent resin from the viewpoint of ensuring sensitivity and developability as a resist agent. If this total amount is less than 0.1 part by mass, sensitivity and developability of the positive-tone resist agent tend to be impaired. If this total amount is more than 20 parts by mass, transparency to radiation tends to decrease, which makes it difficult to obtain a rectangular pattern.

(Acid Diffusion Controller)

It is desirable that the positive-tone resist agent used in the present invention contain an acid diffusion controller. The acid diffusion controller controls diffusion of an acid generated from the acid generator upon exposure in the resist layer to suppress undesired chemical reactions in the unexposed area. The addition of the acid diffusion controller improves storage stability of the resist agent and resolution as a resist. Moreover, the addition of the acid diffusion controller prevents the line width of the resist pattern from changing due to variation of post-exposure delay (PED), which is the time from exposure to post-exposure heat treatment, whereby a resist agent with remarkably superior process stability can be obtained. A nitrogen-containing organic compound and a photodisintegrating base are preferably used as the acid diffusion controller. The photodisintegrating base is an onium salt compound which generates a base exhibiting an acid diffusion controlling effect by decomposing upon exposure.

(Nitrogen-Containing Organic Compound)

As examples of the nitrogen-containing organic compound, compounds shown by the following general formula (7) (hereinafter referred to from time to time as "nitrogen-containing compounds (I)"), compounds having two nitrogen atoms in the molecule (hereinafter referred to from time to time as "nitrogen-containing compounds (II)"), polyamino compounds having three or more nitrogen atoms or polymers thereof (hereinafter collectively referred to from time to time as "nitrogen-containing compounds (III)"), amide group-containing compounds, urea compounds, and nitrogen-containing heterocyclic compounds can be given.

(7)

wherein $R^{17}$ individually represents a hydrogen atom, a substituted or unsubstituted, linear, branched, or cyclic alkyl group, a substituted or unsubstituted aryl group, or a substituted or unsubstituted aralkyl group.

As examples of the nitrogen-containing compound (I), mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and substitute alkylamines such as 2,2',2''-nitrotriethanol; aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline are preferable.

Examples of the preferable nitrogen-containing compounds (II) include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, and N,N,N',N'',N''-pentamethyldiethylenetriamine.

As examples of the nitrogen-containing compound (III), polyethyleneimine, polyallylamine, and a polymer of 2-dimethylaminoethylacrylamide are preferable.

As examples of the amide group-containing compounds, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N'-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminonooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and N-t-butoxycarbonylpyrrolidine; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanuric acid, and the like can be given.

As examples of the preferable urea compounds, urea, methylurea, 1,1-dimethylurea, 1,3-dimethylurea, 1,1,3,3-tetramethylurea, 1,3-diphenylurea, and tri-n-butylthiourea can be given. Examples of the nitrogen-containing heterocyclic compounds include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; and pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, and 1,4-diazabicyclo[2.2.2]octane.

(Photodisintegrating Base)

The photodisintegrating base is an onium salt compound which generates a base exhibiting an acid diffusion controlling effect by decomposing upon exposure. As specific examples of the onium salt compound, the sulfonium salt compound shown by the following general formula (8) and the iodonium salt compound shown by the following general formula (9) can be given,

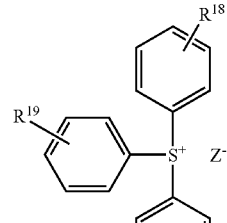

(8)

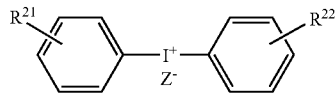

(9)

wherein $R^{18}$ to $R^{22}$ individually represent a hydrogen atom, an alkyl group, an alkoxy group, a hydroxyl group, or a halogen atom and $Z^-$ represents $OH^-$, $R$—$COO^-$, $R$—$SO_3^-$ (wherein R represents an alkyl group, an aryl group, or an alkaryl group), or an anion shown by the following formula (10).

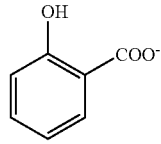

(10)

As specific examples of the sulfonium salt compound and iodonium salt compound, triphenylsulfonium hydrooxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, triphenylsulfonium 10-camphorsulfonate, and 4-t-butoxyphenyl diphenylsulfonium 10-camphorsulfonate can be given.

The above-described acid diffusion controllers may be used either individually or in combination of two or more. The amount of the acid diffusion controller to be added is usually 15 parts by mass or less, preferably 10 parts by mass or less, and still more preferably 5 parts by mass or less for 100 parts by mass of the resist agent resin. If the amount of the acid diffusion controller is more than 15 parts by mass, resolution of the resist agent tends to decrease. If the amount of the acid diffusion controller is less than 0.001 parts by mass, the pattern shape or dimensional accuracy may be decreased depending on the process conditions.

(Solvent)

It is desirable that the positive-tone radiation-sensitive resin composition of the present invention comprise the resist agent resin, the acid generator, the acid diffusion controller, and the like dissolved in a solvent. As the solvent, at least one solvent selected from the group consisting of propylene glycol mono-methyl ether acetate, 2-heptanone, and cyclohexanone (hereinafter referred to as "solvent (1)" is preferable. Solvents other than the solvent (1) (hereinafter referred to as "other solvent") can also be used. In addition, the solvent (1) and the other solvent can be used in combination.

As examples of the other solvents, propylene glycol monoalkyl ether acetates such as propylene glycol monoethyl ether acetate, propylene glycol mono-n-propyl ether acetate, propylene glycol mono-i-propyl ether acetate, propylene glycol mono-n-butyl ether acetate, propylene glycol mono-1-butyl ether acetate, propylene glycol mono-sec-butyl ether acetate, and propylene glycol mono-t-butyl ether acetate; linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, and 2-octanone;

cyclic ketones such as cyclopentanone, 3-methylcyclopentanone, 2-methylcyclohexanone, 2,6-dimethylcyclohexanone, and isophorone; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate;

as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate can be given.

Among these solvents, linear or branched ketones, cyclic ketones, propylene glycol monoalkyl ether acetates, alkyl 2-hydroxypropionates, alkyl 3-alkoxypropionates, γ-butyrolactone, and the like are preferable. These solvents may be used either individually or in combination of two or more.

When the solvent (1) is used together with the other solvents, the proportion of the other solvents is usually 50 mass % or less, preferably 30 mass % or less, and still more preferably 25 mass % or less of the total weight of the solvents. The solvent (1) is contained in the positive-tone resist agent in an amount to make the total solid content of the positive-tone resist agent usually 2 to 70 mass %, preferably 4 to 25 mass %, and more preferably 4 to 10 mass %.

The positive-tone resist agent is prepared by dissolving the above components in the solvent so that the total solid content is in the above range and filtering the solution using a filter with a pore diameter of about 0.02 μm, for example.

Other additives such as surfactants, sensitizers, and aliphatic additives can be optionally added to the positive-tone resist agent.

The surfactant improves applicability, striation, developability, and the like of the radiation-sensitive resin composition. As the surfactants, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF301", "EFTOP EF303", and "EFTOP EF352" (manufactured by JEMCO, Inc.), "MEGAFAC F171" and "MEGAFAC F173" (manufactured by Dainippon Ink and Chemicals, Inc.), "Fluorad FC430" and "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", and "Surflon SC-106" (manufactured by Asahi Glass Co., Ltd.), and the like can be given. These surfactants may be used either individually or in combination of two or more. The amount of the surfactants to be added is usually 2 parts by mass or less for 100 parts by mass of the total amount of the resin having a repeating unit shown by the general formula (1).

The sensitizers absorb radiation energy and transmit the energy to the acid generator, thereby increasing the amount of an acid generated upon exposure. The sensitizers improve apparent sensitivity of the resist agent. As examples of the sensitizer, carbazoles, acetophenones, benzophenones, naphthalenes, phenols, biacetyl, Eosine, Rose Bengal, pyrenes, anthracenes, phenothiazines, and the like can be given. These sensitizers may be used either individually or in combination of two or more. Addition of a dye or a pigment visualizes a latent image in the exposed area, thereby decreasing the effects of halation during exposure. Use of an adhesion improver improves adhesion of the resist film to the substrates. The amount of the sensitizers to be added is usually 50 parts by mass or less for 100 parts by mass of the resin having a repeating unit shown by the general formula (1).

Alicyclic additives that can be added to the positive-tone resist agent include an alicyclic additive having an acid-dissociable group and an alicyclic additive having no acid-dissociable group. These alicyclic additives improve dry etching tolerance, pattern shape, adhesion to substrate, and the like. As specific examples of such alicyclic additives, adamantane derivatives such as 1-adamantanecarboxylic acid, 2-adamantanone, t-butyl-1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[$4.4.0.1^{2,5}.1^{7,10}$]dodecane and the like can be given.

These alicyclic additives may be used either individually or in combination of two or more. The amount of the alicyclic additives to be added is usually 50 parts by mass or less, and preferably 30 parts by mass or less for 100 parts by mass of the resin having a repeating unit shown by the general formula (1). If the amount of the alicyclic additives exceeds 50 parts by mass for 100 parts by mass of the resin having a repeating unit shown by the general formula (1), heat resistance as a resist tends to decrease. As other additives, low molecular weight alkali solubility controllers containing an alkali-soluble resin and/or acid dissociable protecting group, halation inhibitors, preservation stabilizers, antifoaming agents, and the like can be given.

EXAMPLES

The present invention is further described below by way of examples. Note that the present invention is not limited to the following examples. In the examples and comparative examples, the unit "part" refers to "part by mass" and the unit "%" refers to "mass %" unless otherwise indicated. Each property value measuring method and each property evaluation method are given below.

[Mw and Mn]: Mw and Mn were measured by gel permeation chromatography (GPC) using monodisperse polystyrene as a standard and using GPC columns (manufactured by Tosoh Corp., G2000HXL×2, G3000HXL×1, G4000HXL×1) at a flow rate of 1.0 ml/minute, using tetrahydrofuran as an eluting solvent, at a column temperature of 40° C. Dispersibility Mw/Mn was calculated from the Mw and Mn measurement results.

[Proportion of remaining low-molecular weight components]: Measured by high performance liquid chromatography (HPLC) using "Intersil ODS-25 μm column" (4.6 mm in diameter×250 mm) manufactured by GL Sciences Inc., at a flow rate of 1.0 ml/min using an acrylonitrile/0.1% phosphoric acid aqueous solution as an eluting solvent. The low molecular weight component comprises monomers as major components, specifically components having a molecular weight of less than 1000, and preferably a molecular weight of not more than the molecular weight of trimers.

[$^{13}$C-NMR analysis]: The $^{13}$C-NMR analysis of each of the polymers was carried out using "JNM-EX270" (manufactured by JEOL Ltd.) using CDCl$_3$ as a solvent.

Synthesis Example 1

Polymer (A-1)

In 200 g of 2-butanone, 53.93 g (50 mol %) of a compound shown by the following formula (m-1), 10.69 g (10 mol %) of a compound shown by the following formula (m-2), and 35.38 g (40 mol %) of a compound shown by the following formula (m-3) were dissolved, and, 5.58 g of dimethyl-2,2'-azobis(2-methylpropionate) was added to prepare a monomer solution. A 1000 ml three-necked flask was charged with 100 g of 2-butanone, purged with nitrogen for 30 minutes, and heated to 80° C. with stirring. The above monomer solution was added dropwise to the flask using a dripping funnel over three hours. The polymerization reaction was carried out for six hours after initiation of dripping. After completion of polymerization, the polymer solution was cooled with water to 30° C. or less and added to 2000 g of methanol, and the precipitated white powder was collected by filtration. The white powder collected by filtration was washed twice with 400 g of methanol in a slurry state, filtered again, and dried for 17 hours at 50° C. to obtain a polymer (A-1) in the form of white powder (74 g, yield 74%). Mw of the resulting polymer was 6900. As a result of $^{13}$C-NMR analysis, the polymer was found to have the repeating units shown by the following formula (A-1) at a molar ratio of a/b/c=53.0/9.8/37.2

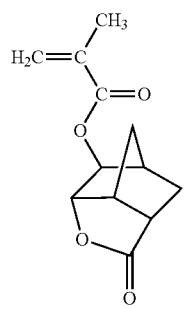

(m-1)

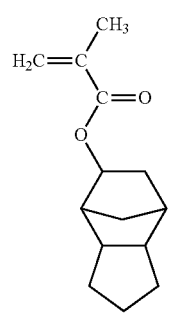

(m-2)

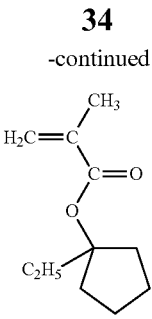

(m-3)

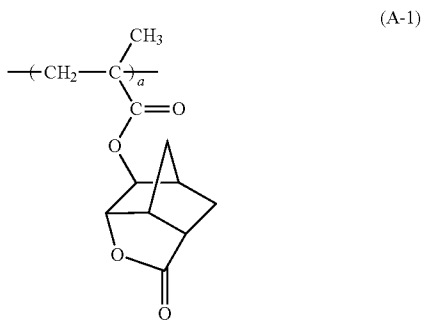

(A-1)

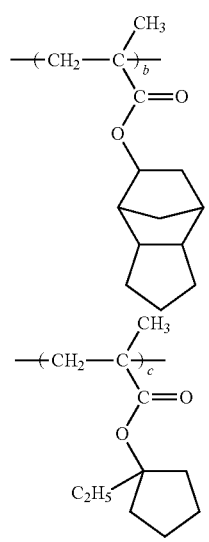

<Polymer (A-1)>

Copolymerization ratio (molar ratio): a/b/c=53.0/9.8/37.2, Mw/Mn=1.70, Mw=6900, proportion of remaining low-molecular weight components=0.03 mass %

Synthesis Examples 2 to 8

Polymers (A-2) to (A-8)

Polymers (A-2) to (A-8) having repeating units shown by the following formulas (A-2) to (A-8) were prepared in the same manner as in Synthetic Example 1, except for using different combinations of monomers.

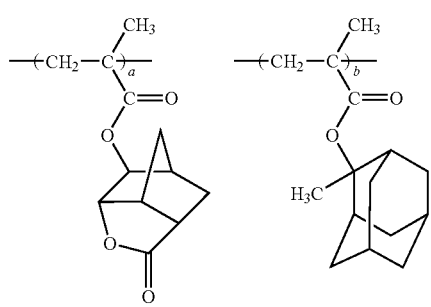
(A-2)

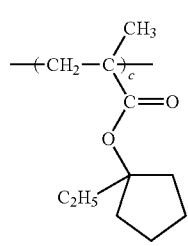

<Polymer (A-2)>

Copolymerization ratio (molar ratio): a/b/c=50/37/13, Mw/Mn=1.62, Mw=5200, amount of remaining low-molecular weight components=0.03 mass %

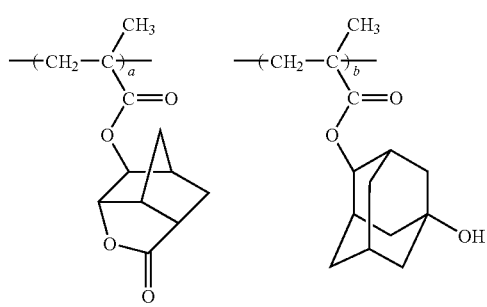
(A-3)

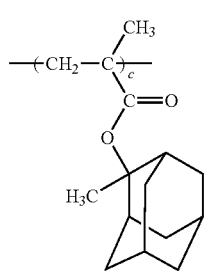

<Polymer (A-3)>

Copolymerization ratio (molar ratio): a/b/c=47.3/15.8/36.9, Mw/Mn=1.60, Mw=5000, amount of remaining low-molecular weight components=0.05 mass %

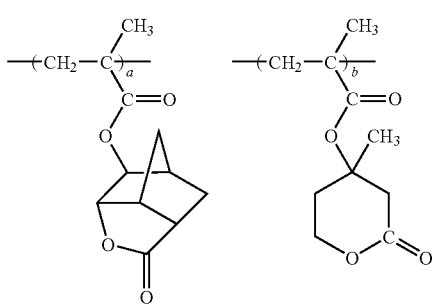
(A-4)

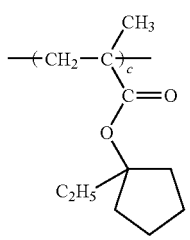

<Polymer (A-4)>

Copolymerization ratio (molar ratio): a/b/c=53.6/9.8/36.6, Mw/Mn=69, Mw=8100, amount of remaining low-molecular weight components=0.04 mass %

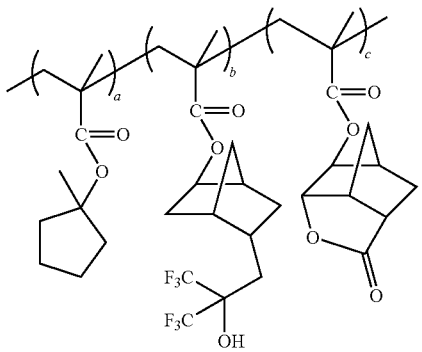
(A-5)

<Polymer (A-5)>

Copolymerization ratio (molar ratio): a/b/c=40.4/15.5/45.1, Mw/Mn=1.73, Mw=6100, amount of remaining low-molecular weight components=0.08 mass %

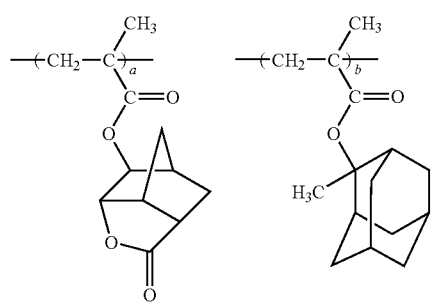
(A-6)

-continued

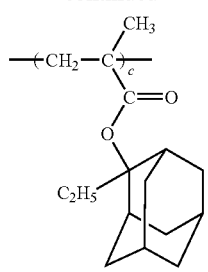

<Polymer (A-6)>

Copolymerization ratio (molar ratio): a/b/c=50.0/36.9/13.1, Mw/Mn=1.78, Mw=8200, amount of remaining low-molecular weight components=0.03 mass %

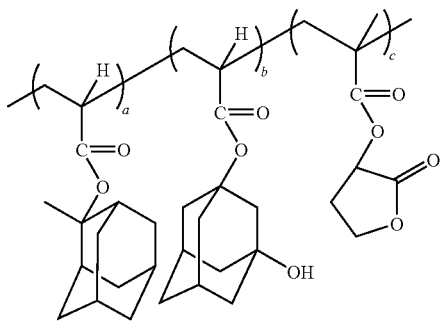

(A-7)

<Polymer (A-7)>

Copolymerization ratio (molar ratio): a/b/c=35.4/28.5/35.1, Mw/Mn=1.93, Mw=5900, amount of remaining low-molecular weight components=0.06 mass %

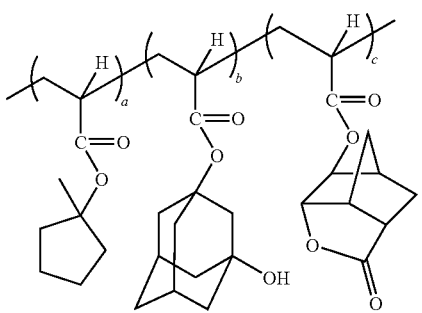

(A-8)

<Polymer (A-8)>

Copolymerization ratio (molar ratio): a/b/c=30.4/28.5/40.1, Mw/Mn=1.93, Mw=5500, amount of remaining low-molecular weight components=0.07 mass %

(Preparation of Positive-Tone Resist Agent)

First resist agents (1) to (10) and second resist agents (11) to (15) were prepared using the polymers (A-1) to (A-8), the acid generators (D), acid diffusion controllers (E), and solvents (F) at proportions shown in Tables 1 and 2.

TABLE 1

| First resist agent | Polymer | | Acid generator | | Acid diffusion controller | | Solvent | |
|---|---|---|---|---|---|---|---|---|
| | Type | Part | Type | Part | Type | Part | Type | Part |
| 1 | A-1 | 100 | D-1/D-2 | 6/1 | E-1 | 0.5 | F-1/F-2 | 1420/30 |
| 2 | A-2 | 100 | D-1/D-2 | 6/1 | E-1 | 0.5 | F-1/F-2 | 1420/30 |
| 3 | A-3 | 100 | D-1/D-2 | 6/1 | E-1 | 0.5 | F-1/F-2 | 1420/30 |
| 4 | A-4 | 100 | D-1/D-2 | 6/1 | E-1 | 0.5 | F-1/F-2 | 1420/30 |
| 5 | A-6 | 100 | D-1/D-2 | 6/1 | E-1 | 0.5 | F-1/F-2 | 1420/30 |
| 6 | A-7 | 100 | D-1/D-2 | 6/1 | E-1 | 0.5 | F-1/F-2 | 1420/30 |
| 7 | A-8 | 100 | D-1/D-2 | 6/1 | E-1 | 0.5 | F-1/F-2 | 1420/30 |
| 8 | A-1 | 100 | D-1/D-2 | 6/1 | E-2 | 3 | F-1/F-2 | 1420/30 |
| 9 | A-2 | 100 | D-1/D-3 | 6/1 | E-1 | 0.5 | F-1/F-2 | 1420/30 |
| 10 | A-2 | 100 | D-1/D-4 | 6/1 | E-1 | 0.5 | F-1/F-2 | 1420/30 |

TABLE 2

| Second resist agent | Polymer | | Acid generator | | Acid diffusion controller | | Solvent | |
|---|---|---|---|---|---|---|---|---|
| | Type | Part | Type | Part | Type | Part | Type | Part |
| 11 | A-5 | 100 | D-1 | 7 | E-2 | 2 | F-1/F-2 | 1420/30 |
| 12 | A-5 | 100 | D-2 | 7 | E-3 | 3 | F-1/F-2 | 1420/30 |
| 13 | A-5 | 100 | D-2 | 7 | E-1/E-2 | 0.2/1 | F-1/F-2 | 1420/30 |
| 14 | A-5 | 100 | D-2 | 7 | E-1 | 0.5 | F-1/F-2 | 1420/30 |
| 15 | A-2 | 100 | D-2 | 7 | E-2 | 3 | F-1/F-2 | 1420/30 |

<Acid Generator (D)>

(D-1): 4-nonafluoro-n-butylsulfonyloxyphenyl.diphenylsulfonium nonafluoro-n-butanesulfonate (D-2): triphenylsulfonium.nonafluoro-n-butanesulfonate (D-3): triphenylsulfonium 2-bicyclo[2.2.1]hept-2-yl-1,1,2,2-tetrafluoroethanesulfonate, (D-4): triphenylsulfonium 2-bicyclo[2.2.1]heptan-2-yl-1,1-difluoroethanesulfonate, <Acid Diffusion Controller (E)>

(E-1): N-t-butoxycarbonylpyrrolidine (E-2): triphenylsulfonium salicylate (E-3): triphenylsulfonium 10-camphorsulfonate <Solvent (F)>

(F-1): Propylene glycol monomethyl ether acetate (F-2): γ-butyrolactone

Synthesis Example 9

Polymer (B-1)

As starting raw materials, 92 g of p-hydroxyphenylmethacrylanilide, 46 g of t-butoxystyrene, 13 g of hydroxybutylacrylate, and 12.8 g of azobisisobutyronitrile were dissolved in 600 g of isopropanol and reacted under reflux conditions (82° C.) for six hours to polymerize the monomers. After cooling the reaction vessel with flowing water, 150 g of isopropanol (IPA) was added and the mixture was poured into 4500 g of methanol while stirring. The resulting reprecipitate was filtered by suction. This reprecipitation procedure (from addition of IPA through suction filtration) was repeated four times and the resulting product was dried at 50° C. under vacuum. As a result, 121 g of a polymer (B-1) having a repeating unit shown by the following formula (B-1) with a molar ratio of p-hydroxyphenylmethacrylanilide/t-butoxystyrene/hydroxybutylacrylate=58/32/10, Mw of 5400, and Mw/Mn of 1.6 was obtained (yield: 81%).

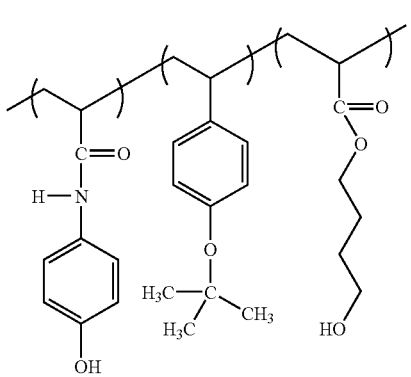

(B-1)

Synthesis Example 10

Polymer (B-2)

The polymerization reaction was carried out in the same manner as in Synthesis Example 9 except for using p-hydroxymethacrylanilide and p-t-butoxystyrene as starting raw materials, to optain 110 g of a polymer (B-2) having a repeating unit shown by the following formula (B-2) with a molar ratio of p-hydroxymethacrylanilide (x)/p-t-butoxystyrene (y)=60/40, Mw of 5500, and Mw/Mn of 1.5 (yield: 75%).

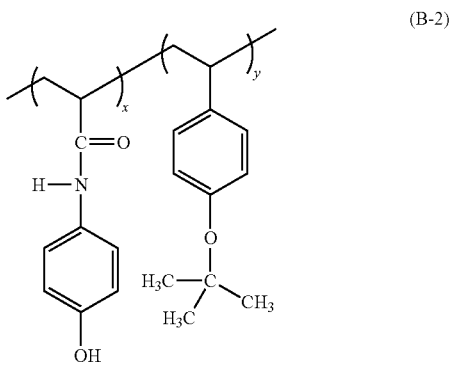

(B-2)

Synthesis Example 11

Polymer (B-3)

As starting raw materials, 17.21 g of p-hydroxymethacrylanilide, 8.56 g of t-butoxystyrene, 4.23 g of (((trifluoromethyl)sulfonyl)amino)ethyl-1-methacrylate, and 2.13 g of azobisisobutyronitrile were dissolved in 90 g of isopropanol and reacted under reflux conditions (82° C.) for six hours to polymerize the monomers. After cooling the reaction vessel with flowing water, the mixture was poured into 900 g of methanol while stirring. The resulting reprecipitate was filtered by suction. After repeating the reprecipitation procedure four times, the resulting solid was dried at 50° C. under vacuum. As a result, 26 g of a polymer (B-3) having a repeating unit shown by the following formula (B) with a molar ratio of p-hydroxylmethacrylanilide (x)/t-butoxystyrene (y)/2-(((trifluoromethyl)sulfonyl)amino)ethyl-1-methacrylate (z)=61/29/10, Mw of 5800, and Mw/Mn of 1.6 was obtained (yield: 87%).

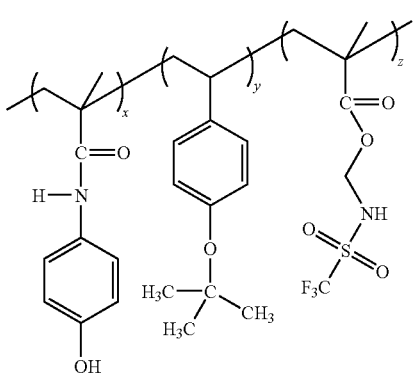

(B)

Synthesis Example 12

Polymer (B-4)

The same polymerization reaction as in Synthesis Example 11 was carried out except for using the starting raw materials at different proportion to obtain 24 g of a polymer (B-4) having a repeating unit shown by the above formula (B) with a molar ratio of p-hydroxymethacrylanilide (x)/t-butoxystyrene (y)/2-(((trifluoromethyl)sulfonyl)amino)ethyl-1-methacrylate (z)=61/34/5, Mw of 5200, and Mw/Mn of 1.5 (yield: 80%).

Synthesis Example 13

Polymer (B-5)

The same polymerization reaction as in Synthesis Example 11 was carried out except for using the starting raw materials at different proportion to obtain 27 g of a polymer (B-5) having a repeating unit shown by the above formula (B) with a molar ratio of p-hydroxymethacrylanilide (x)/t-butoxystyrene (y)/2-(((trifluoromethyl)sulfonyl)amino)ethyl-1-methacrylate (z)=52/38/10, Mw of 5500, and Mw/Mn of 1.5 (yield: 90%).

Examples 1 to 8

Preparation of Resin Composition

Resin compositions (A) to (H) (Examples 1 to 8) were prepared from the synthesized polymers (B-1) to (B-5) by adding the crosslinking agents (C) and solvents (F) according to the formulation shown in the Table 3, stirring the mixture for three hours, and filtering the resulting mixture using a filter with a pore diameter of 0.03 μm.

TABLE 3

| Example | Resin composition | Polymer Type | Polymer Part | Crosslinking agent Type | Crosslinking agent Part | Solvent Type | Solvent Part |
|---|---|---|---|---|---|---|---|
| 1 | A | B-1 | 100 | C-1 | 15 | F-3 | 2400 |
| 2 | B | B-2 | 100 | C-2 | 15 | F-3 | 2400 |
| 3 | C | B-2 | 100 | C-1 | 15 | F-3 | 2400 |
| 4 | D | B-3 | 100 | C-1 | 30 | F-3 | 2620 |
| 5 | E | B-4 | 100 | C-1 | 30 | F-3 | 2620 |
| 6 | F | B-5 | 100 | C-1 | 30 | F-3 | 2620 |

TABLE 3-continued

| | Resin composition | Polymer | | Crosslinking agent | | Solvent | |
|---|---|---|---|---|---|---|---|
| Example | | Type | Part | Type | Part | Type | Part |
| 7 | G | B-4 | 100 | C-1 | 30 | F-4 | 2620 |
| 8 | H | B-4 | 100 | C-2 | 30 | F-4 | 2620 |

<Crosslinking Component (C)>

C-1: Nikalac MX-750 (manufactured by Nippon Carbide Industries Co., Inc.)
C-2: Dipentaerythritol hexakis(3-ethyl-3-oxetanylmethyl) ether <Solvent (F)>
F-3: 1-butanol
F-4: 4-methyl-2-pentanol Reference Example 1

A coated film with a thickness of 77 nm was formed on an 8 inch silicon wafer by spin coating a lower layer antireflection film ("ARC29A" (trade name) manufactured by Brewer Science Inc.) using a "CLEAN TRACK ACT8" (trade name) manufactured by Tokyo Electron Ltd.) and baking (PB, 205° C., 60 seconds). The first resist agent (1) was spin coated using the "CLEAN TRACK ACT8" (trade name), baked (PB, 115° C., 60 seconds), and cooled (23° C., 30 seconds) to obtain a coated film with a thickness of 150 nm. Next, the film was exposed to radiation using an ArF liquid immersion lithographic apparatus ("NSR-S306C" (trade name) manufactured by NIKON Corporation) under the optical conditions of NA: 0.78 and sigma: 0.85 dipole through a mask with a mask size of 110 nm line/220 nm pitch. After PEB (115° C. for 60 seconds) on a hot plate of a "CLEAN TRACK ACT8" (trade name) and cooling (23° C., 30 seconds), the exposed resist was developed by paddle development (30 seconds) using a developing cup LD nozzle and 2.38 mass % TMAH aqueous solution, and washed with ultra pure water. An evaluation substrate A on which a first pattern was formed was obtained by centrifugation at 2000 rpm for 15 seconds.

The resin composition (C) was spin coated onto the resulting first pattern obtained on the substrate A for evaluation using a "CLEAN TRACK ACT8" (trade name) to obtain a film with a thickness of 150 nm, followed by baking (PB) at 150° C. for 60 seconds. After cooling (23° C., 30 seconds) on a cooling plate of a "CLEAN TRACK ACT8" (trade name), the exposed resist was developed by paddle development (60 seconds) using a developing cup LD nozzle and 2.38 mass % TMAH aqueous solution, and washed with ultra pure water. An evaluation substrate B on which the second pattern was formed was obtained by centrifugation at 2000 rpm for 15 seconds.

Reference Examples 2 to 15

Evaluation substrates B on which the second pattern was formed were obtained in the same manner as in Synthetic Example 1, except that the first resist agents and insolubilizing resin compositions shown in Table 4 were used and PB and PEB conditions shown in Table 4 were employed.

TABLE 4

| Reference Example | First resist agent | PB Temp. (° C.) | Time (s) | PEB Temp. (° C.) | Time (s) | Resin composition | PB Temp. (° C.) | Time (s) | Pattern evaluation |
|---|---|---|---|---|---|---|---|---|---|
| 1 | 1 | 115 | 60 | 115 | 60 | C | 150 | 60 | Good |
| 2 | 2 | 120 | 60 | 115 | 60 | C | 150 | 60 | Good |
| 3 | 3 | 120 | 60 | 130 | 60 | C | 150 | 60 | Good |
| 4 | 4 | 100 | 60 | 110 | 60 | C | 150 | 60 | Good |
| 5 | 5 | 115 | 60 | 110 | 60 | C | 150 | 60 | Good |
| 6 | 6 | 115 | 90 | 105 | 90 | C | 150 | 60 | Good |
| 7 | 7 | 115 | 60 | 110 | 60 | C | 150 | 60 | Good |
| 8 | 8 | 115 | 60 | 110 | 60 | A | 150 | 60 | Good |
| 9 | 9 | 130 | 60 | 110 | 60 | B | 150 | 60 | Good |
| 10 | 10 | 130 | 60 | 110 | 60 | C | 150 | 60 | Good |
| 11 | 1 | 115 | 60 | 115 | 60 | D | 150 | 60 | Good |
| 12 | 1 | 115 | 60 | 115 | 60 | E | 150 | 60 | Good |
| 13 | 1 | 115 | 60 | 115 | 60 | F | 150 | 60 | Good |
| 14 | 1 | 115 | 60 | 115 | 60 | G | 150 | 60 | Good |
| 15 | 1 | 115 | 60 | 115 | 60 | H | 150 | 60 | Good |

Example 9

The second resist agent (11) was spin coated onto the second pattern obtained on the evaluation substrate B in the Reference Example 1 using the "CLEAN TRACK ACT8" (trade name), baked (PB, 130° C., 60 seconds), and cooled (23° C., 30 seconds) to obtain a coated film (second resist layer) with a thickness of 150 nm. The entire surface of the film was exposed to radiation using an ArF liquid immersion lithographic apparatus under the optical conditions of NA: 0.78 and sigma: 0.90 conventional. After PEB (110° C., 60 seconds) on a hot plate of a "CLEAN TRACK ACT8"(trade name) and cooling (23° C., 30 seconds), the exposed resist was developed by paddle development (30 seconds) using a developing cup LD nozzle and 2.38 mass % TMAH aqueous solution, and rinsed in ultra pure water. A substrate 10 (evaluation substrate C) on which the third pattern 13 shown in FIG. 7 has been formed was obtained by centrifugal drying at 2000 rpm for 15 seconds.

Examples 10 to 23

Evaluation substrates C on which the third pattern has been formed were obtained in the same manner as in Example 9, except that the evaluation substrates B obtained in the Reference Examples 2 to 15 and the second resist agents were used and PB and PEB conditions shown in Table 5 were employed.

Comparative Examples 1 to 3

Evaluation substrates C were obtained in the same manner as in Example 9 without processing the evaluation substrates A obtained respectively in Reference Examples 1 to 3 under the same conditions as those shown in Table 5, except that the first resist agent (1) was spin coated onto the first pattern (Comparative Example 1), the second resist agent (11) was spin coated onto the first pattern (Comparative Example 2) and the second resist agent was not spin coated onto the first pattern (Comparative Example 3).

Examples 24 and 25

The second resist agents (11) and (12) were spin coated onto the second pattern obtained on the evaluation substrate B in the Reference Examples 1 and 2 using the "CLEAN TRACK ACT8" (trade name), baked (PB, 130° C., 60 seconds), and cooled (23° C., 30 seconds) to obtain coated films (second resist layers) with a thickness of 150 nm. The entire surfaces of the films were exposed to radiation using an ArF liquid immersion lithographic apparatus under the optical conditions of NA: 0.78 and sigma: 0.90 conventional. After PEB (110° C., 60 seconds) on a hot plate of a "CLEAN TRACK ACT8" (trade name) and cooling (23° C., 30 seconds), the exposed resists were developed by paddle development (30 seconds) using a developing cup LD nozzle and 2.38 mass % TMAH aqueous solution, rinsed in ultra pure water, and dried by centrifugation at 2000 rpm for 15 seconds. Substrates 10 (evaluation substrate C) on which the third pattern 13 shown in FIG. 7 has been formed were obtained by etching using "NA-1300" (manufactured by ULVAC, Inc.) under the conditions shown in Table 7.

(Pattern Evaluation)

Resist patterns formed on the evaluation substrates A to C were evaluated using a scanning electron microscope ("S-9380" (trade name) manufactured by Hitachi High-Technologies, Inc.). Presence or absence of pattern formation with a 155 nm line/220 nm pitch on the evaluation substrate A was confirmed. Presence or absence of pattern formation with a 165 nm line/220 nm pitch on the evaluation substrate B was confirmed. Pattern formation was evaluated as "Good" when the first pattern remained, and as "Bad" when the first pattern has disappeared. The evaluation results are shown in Table 4. The evaluation substrates C were evaluated as "Good" when a third pattern with a 55 nm line/110 nm pitch (about 55 nm 1L/1S) was formed by separation of the second pattern on the evaluation substrate B, and as "Bad" when (i) the second pattern has disappeared or (ii) the second pattern was not separated. The evaluation results are shown in Tables 5 and 6.

TABLE 5

| | First layer | | Second layer | | | | | | Second layer |
|---|---|---|---|---|---|---|---|---|---|
| | First resist agent | Resin composition | First resist agent | Second resist agent | PB Temp. (° C.) | Time (s) | PEB Temp. (° C.) | Time (s) | pattern evaluation |
| Example 9 | 1 | C | — | 11 | 130 | 60 | 110 | 60 | Good |
| Example 10 | 2 | C | — | 12 | 130 | 60 | 110 | 60 | Good |
| Example 11 | 3 | C | — | 13 | 130 | 60 | 110 | 60 | Good |
| Example 12 | 4 | C | — | 14 | 130 | 60 | 110 | 60 | Good |
| Example 13 | 5 | C | — | 15 | 130 | 60 | 110 | 60 | Good |
| Example 14 | 6 | C | — | 11 | 130 | 90 | 110 | 90 | Good |
| Example 15 | 7 | C | — | 11 | 130 | 60 | 110 | 60 | Good |
| Example 16 | 8 | A | — | 11 | 130 | 60 | 110 | 60 | Good |
| Example 17 | 9 | B | — | 11 | 130 | 60 | 110 | 60 | Good |
| Example 18 | 10 | C | — | 11 | 130 | 60 | 110 | 60 | Good |
| Example 19 | 1 | D | — | 12 | 130 | 60 | 110 | 60 | Good |
| Example 20 | 1 | E | — | 12 | 130 | 60 | 110 | 60 | Good |
| Example 21 | 1 | F | — | 12 | 130 | 60 | 110 | 60 | Good |
| Example 22 | 1 | G | — | 12 | 130 | 60 | 110 | 60 | Good |
| Example 23 | 1 | H | — | 12 | 130 | 60 | 110 | 60 | Good |
| Comparative Example 1 | 1 | — | 1 | — | 130 | 60 | 110 | 60 | Bad |
| Comparative Example 2 | 2 | — | — | 11 | 130 | 60 | 110 | 60 | Bad |
| Comparative Example 3 | 3 | — | — | — | 130 | 60 | 110 | 60 | Bad |

TABLE 6

| | First layer | | Second layer | | | | | | Second layer |
|---|---|---|---|---|---|---|---|---|---|
| | First resist agent | Resin composition | First resist agent | Second resist agent | PB Temp. (° C.) | Time (s) | PEB Temp. (° C.) | Time (s) | pattern evaluation |
| Example 24 | 1 | C | — | 11 | 130 | 60 | 110 | 60 | Good |
| Example 25 | 2 | C | — | 12 | 130 | 60 | 110 | 60 | Good |

TABLE 7

| | Etching conditions | | | | |
|---|---|---|---|---|---|
| | Temperature (° C.) | Output (W) | Time (s) | Gas | Gas flow rate (sccm) |
| Example 24 | 50 | 1000 W | 90 | Oxygen | 1200 |
| Example 25 | 25 | 200 W | 40 | Nitrogen | 800 |

INDUSTRIAL APPLICABILITY

According to the pattern forming method of the present invention, a pattern can be made precisely miniaturized by one alignment and a good pattern surpassing the wavelength limit can be economically formed. The resist pattern forming method of the present invention can be suitably used in the field of microfabrication represented by manufacture of integrated circuit devices which will become more and more minute.

The invention claimed is:

1. A pattern forming method comprising:
   (1) forming a first resist layer on a substrate using a first positive-tone radiation-sensitive resin composition, selectively exposing the first resist layer, and developing the exposed first resist layer to form a first pattern;
   (2) applying a resin composition comprising a hydroxyl group-containing resin and a solvent to the first pattern, baking the applied resin composition, and washing the baked resin composition using a developer to form a second pattern in which the surface of the first pattern is covered with the resin composition, the hydroxyl group-containing resin becoming insoluble or scarcely soluble in the developer when baked; and
   (3) totally or selectively exposing the second pattern to make the second pattern partly soluble in the developer, and developing the exposed second pattern to form a third pattern in which at least a hole or a groove is formed in the second pattern.

2. The pattern forming method according to claim 1, further comprising:
   applying a second positive-tone radiation-sensitive resin composition to the second pattern, and baking the applied composition to form a second resist layer after the step (2) but before the step (3),
   wherein the step (3) includes totally or selectively exposing the second resist layer and the second pattern to make the second resist layer and the second pattern partly soluble in the developer.

3. The resist pattern forming method according to claim 2, wherein at least one of the first positive-tone radiation-sensitive resin composition and the second positive-tone radiation-sensitive resin composition comprises a resin having a repeating unit shown by the following general formula (1), $$\begin{array}{c} \text{---}(CH_2\text{---}\underset{|}{\overset{R^1}{C}})\text{---} \\ \phantom{xx}C=O \\ \phantom{xxx}| \\ \phantom{xxx}O \\ \phantom{xxxx}\underset{R^2\ R^2}{\overset{|}{C}}\text{---}R^2 \end{array} \tag{1}$$

wherein $R^1$ represents a hydrogen atom or a methyl group, and $R^2$s individually represent a monovalent alicyclic hydrocarbon group having 4 to 20 carbon atoms or a derivative thereof, or a linear or branched alkyl group having 1 to 4 carbon atoms, provided that (i) at least one of the $R^2$s is a monovalent alicyclic hydrocarbon group having 4 to 20 carbon atoms or a derivative thereof, or (ii) two of the $R^2$s form a divalent alicyclic hydrocarbon group having 4 to 20 carbon atoms or a derivative thereof together with the carbon atom to which the two $R^2$s bond, and the remaining $R^2$ is a linear or branched alkyl group having 1 to 4 carbon atoms, a monovalent alicyclic hydrocarbon group having 4 to 20 carbon atoms, or a derivative thereof.

4. The pattern forming method according to claim 2, wherein the second positive-tone radiation-sensitive resin composition comprises at least one of an iodonium salt compound and a sulfonium salt compound that are decomposed upon exposure to generate a base.

5. The pattern forming method according to claim 3, wherein the second positive-tone radiation-sensitive resin composition comprises at least one of an iodonium salt compound and a sulfonium salt compound that are decomposed upon exposure to generate a base.

6. A resin composition that is used in the step (2) of the pattern forming method according to claim 1, the resin composition comprising a hydroxyl group-containing resin and a solvent, the hydroxyl group-containing resin becoming insoluble or scarcely soluble in a developer when baked.

7. A resin composition that is used in the step (2) of the pattern forming method according to claim 2, the resin composition comprising a hydroxyl group-containing resin and a solvent, the hydroxyl group-containing resin becoming insoluble or scarcely soluble in a developer when baked.

8. A resin composition that is used in the step (2) of the pattern forming method according to claim 3, the resin composition comprising a hydroxyl group-containing resin and a solvent, the hydroxyl group-containing resin becoming insoluble or scarcely soluble in a developer when baked.

9. A resin composition that is used in the step (2) of the pattern forming method according to claim 4, the resin composition comprising a hydroxyl group-containing resin and a solvent, the hydroxyl group-containing resin becoming insoluble or scarcely soluble in a developer when baked.

10. A resin composition that is used in the step (2) of the pattern forming method according to claim 5, the resin composition comprising a hydroxyl group-containing resin and a solvent, the hydroxyl group-containing resin becoming insoluble or scarcely soluble in a developer when baked.

11. The resin composition according to claim 6, wherein the hydroxyl group-containing resin has been obtained by polymerizing a monomer component which contains at least one of hydroxyacrylanilide and hydroxymethacrylanilide.

12. The resin composition according to claim 7, wherein the hydroxyl group-containing resin has been obtained by polymerizing a monomer component which contains at least one of hydroxyacrylanilide and hydroxymethacrylanilide.

13. The resin composition according to claim 8, wherein the hydroxyl group-containing resin has been obtained by polymerizing a monomer component which contains at least one of hydroxyacrylanilide and hydroxymethacrylanilide.

14. The resin composition according to claim 9, wherein the hydroxyl group-containing resin has been obtained by polymerizing a monomer component which contains at least one of hydroxyacrylanilide and hydroxymethacrylanilide.

15. The resin composition according to claim 10, wherein the hydroxyl group-containing resin has been obtained by polymerizing a monomer component which contains at least one of hydroxyacrylanilide and hydroxymethacrylanilide.

16. The resin composition according to claim 6, wherein the hydroxyl group-containing resin has a repeating unit shown by the following general formula (4),

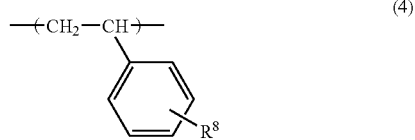

(4)

wherein $R^8$ represents a hydrogen atom, a linear or branched alkyl group having 1 to 8 carbon atoms, or a linear or branched alkoxy group having 1 to 8 carbon atoms.

17. The resin composition according to claim 7, wherein the hydroxyl group-containing resin has a repeating unit shown by the following general formula (4),

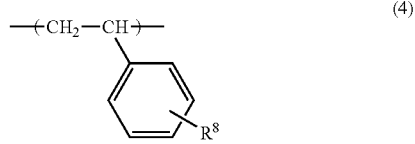

(4)

wherein $R^8$ represents a hydrogen atom, a linear or branched alkyl group having 1 to 8 carbon atoms, or a linear or branched alkoxy group having 1 to 8 carbon atoms.

18. The resin composition according to claim 11, wherein the hydroxyl group-containing resin has a repeating unit shown by the following general formula (4),

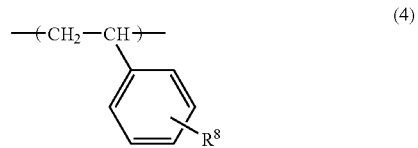

(4)

wherein $R^8$ represents a hydrogen atom, a linear or branched alkyl group having 1 to 8 carbon atoms, or a linear or branched alkoxy group having 1 to 8 carbon atoms.

19. The resin composition according to claim 12, wherein the hydroxyl group-containing resin has a repeating unit shown by the following general formula (4),

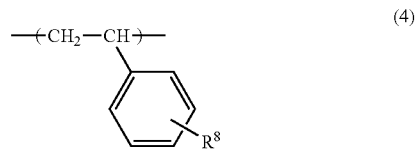

(4)

wherein $R^8$ represents a hydrogen atom, a linear or branched alkyl group having 1 to 8 carbon atoms, or a linear or branched alkoxy group having 1 to 8 carbon atoms.

* * * * *